United States Patent [19]

Miyazaki et al.

[11] Patent Number: 5,534,805
[45] Date of Patent: Jul. 9, 1996

[54] SYNCHRONIZED CLOCK GENERATING APPARATUS

[75] Inventors: Yukio Miyazaki; Takenori Okitaka; Makoto Hatakenaka; Junji Mano, all of Itami, Japan

[73] Assignee: Mitsubishi Denki Kabushiki Kaisha, Tokyo, Japan

[21] Appl. No.: 449,496

[22] Filed: May 24, 1995

Related U.S. Application Data

[63] Continuation-in-part of Ser. No. 289,837, Aug. 12, 1994, Pat. No. 5,369,318, which is a continuation of Ser. No. 809,007, Dec. 17, 1991, abandoned.

[30] Foreign Application Priority Data

| Dec. 26, 1990 | [JP] | Japan | 2-406357 |
| Aug. 1, 1991 | [JP] | Japan | 3-193033 |
| Nov. 11, 1991 | [JP] | Japan | 3-293988 |

[51] Int. Cl.$^6$ .................................... H03L 7/00
[52] U.S. Cl. ................. 327/144; 327/146; 327/154; 327/155
[58] Field of Search ................... 327/146, 155, 327/144, 154, 141, 2, 3, 12, 102, 233, 284, 285

[56] References Cited

U.S. PATENT DOCUMENTS

| 4,851,710 | 7/1989 | Grivna | 327/155 |
| 4,973,860 | 11/1990 | Ludwig | 327/146 |
| 5,086,236 | 2/1992 | Feemster | 327/146 |
| 5,252,867 | 10/1993 | Sorrells et al. | 327/153 |

FOREIGN PATENT DOCUMENTS

| 63-41466 | 8/1988 | Japan . |
| 1320482 | 12/1989 | Japan . |

*Primary Examiner*—Terry Cunningham
*Attorney, Agent, or Firm*—Morrison Law Firm

[57] ABSTRACT

A synchronized clock generating apparatus includes a delayed clock generating circuit including a plurality of serially connected delaying elements for generating delayed clock signals delayed successively to an incoming basic clock signal. A plurality of storage elements store therein a predetermined level in response to transitions occurring in associated ones of the basic and delayed clock signals after an asynchronous trigger signal is applied thereto. A clock selection logic circuit is controlled by the output signal from the storage elements for detecting the clock signal transition occurring closest in time to the application of the asynchronous trigger signal, and for selecting a desired one of the clock signals based on the result of the detection, as a synchronized clock input signal.

14 Claims, 20 Drawing Sheets

5,534,805

SYNCHRONIZED CLOCK GENERATING APPARATUS

This is a continuation-in-part of application Ser. No. 08/289,837 filed Aug. 12 1994, now U.S. Pat. No. 5,369,318 which was a continuation of application Ser. No. 07/809,007 filed Dec. 17, 1991, and now abandoned. The priority of application Ser. No. 07/809,007 filed on Dec. 17, 1991 in the United States Patent and Trademark Office is claimed under 35 USC 120.

BACKGROUND OF THE INVENTION

This invention relates to a synchronized clock generating apparatus which can provide a high frequency clock signal which is synchronized with an externally applied asynchronous trigger input signal.

The only conventional method for improving the synchronization precision of an output clock which is synchronized with an asynchronous trigger input has been to increase the frequency of an input clock signal.

For instance, for a high synchronization precision of 1 ns, an input clock signal at a high frequency of 1 GHz is required. However, increasing the frequency of the input clock signal to 1 GHz will cause problems, such as the generation of internal noise and generation of undesirable radiations, and accordingly, such a method is not feasible.

Furthermore, to form a 1 GHz clock signal generating circuit and its associated frequency-divider by ordinary CMOS circuit techniques is not easy, and therefore, it requires a special technique, such as the very high speed bipolar technique, which considerably increases the manufacturing costs of the apparatus.

FIG. 1 is a block diagram of a conventional synchronized clock generating apparatus, and FIG. 2 shows various waveforms that represent the operation of the apparatus of FIG. 1. A high frequency clock signal CK generated by a high frequency clock signal generating circuit 102 is applied to a clock input terminal A of a counter 103 and also to a clock input terminal A of a frequency-divider 104. A trigger input terminal B of counter 103 receives, as a count enable signal, a trigger signal TR via a trigger input terminal 100 from a trigger signal source 105. The trigger signal TR is asynchronous with the clock signal CK.

The counter 103 starts counting the number of clock pulses of the high frequency clock signal CK from high frequency clock generating circuit 102, immediately after a transition $t_1$ (FIG. 2) in the trigger signal TR from a high logic level H to a low logic level L. When the count reaches a prescribed value, for example, 3, counter 103 generates a frequency-division enable signal DE for application to an enable signal input terminal B of frequency-divider 104. In response to the frequency-division enable signal DE applied to the enable signal input terminal B, frequency-divider 104 starts frequency-division of the high frequency clock signal CK and produces an output clock signal $CK_{out}$ having a transition occurring every four cycles, for example, of the high frequency clock signal CK.

With the above-described conventional clock signal generating apparatus, the output clock signal $CK_{out}$ will be produced with the same timing even if the H-to-L transition $t_1$ in the trigger signal TR varies within a range T defined by broken lines. Accordingly, in order to increase the precision of synchronization of the output clock signal $CK_{out}$, the frequency of the high frequency clock signal CK must be increased. The synchronization precision becomes higher as the frequency of the high frequency clock signal CK becomes higher. Thus, the relationship between them can be expressed as Synchronization Precision≈Period of High Frequency Clock Signal.

OBJECTS AND SUMMARY OF THE INVENTION

An object of the present invention is to provide a synchronized clock generating apparatus which can generate an output clock signal with a high synchronization precision without using a higher frequency basic clock signal.

Another object of the present invention is to generate an output clock signal which is shifted by substantially a constant time from a level change in a trigger signal applied asynchronously with the basic clock signal without regard to the timing of the application of the asynchronous trigger signal relative to the basic clock signal.

Still another object of the present invention is to provide a synchronous clock generating apparatus which can produce an output clock signal having a jitter no greater than about ±1 nanosecond, without resorting to the use of a circuit which generates a clock signal at a high frequency such as 1 GHz.

Briefly stated, a synchronized clock generating apparatus includes a delayed clock generating circuit which includes a plurality of serially connected delaying elements and provides a plurality of delayed clock signals which are successively delayed versions of a basic clock signal applied to it. The apparatus further includes a plurality of storage elements for storing a predetermined logic level in response to a change in the level of the basic or delayed clock signal occurring after the application of a trigger signal which is asynchronous with the basic clock signal. A clock selection logic circuit is provided which is controlled by the output signal from the storage elements to detect a change in the clock signals including the basic and delayed clock signals, which occurs at a time closest to the time of application of the asynchronous trigger signal, and to select a desired one of the clock signals in accordance with the detection of the closest occurrence of the level change. The selected clock signal is provided as a synchronized output clock signal.

According to an embodiment of the present invention, a synchronized clock generating apparatus includes a delayed clock generating circuit; the delayed clock generating circuit including a clock input having a basic clock signal applied thereto; the delayed clock generating circuit including further a plurality of delaying elements connected in series; the plurality of delaying elements being effective for producing a plurality of delayed clock signals each successively delayed relative to the basic clock signal; a plurality of flip-flops, each having a respective one of the plurality of delayed clock signals applied to a first input thereof; the plurality of flip-flops each having a second input with a trigger signal, asynchronous with the basic clock signal, applied thereto; each of the plurality of flip-flops having a third input and a flip-flop output; the plurality of flip-flops receiving the trigger signal and the delayed clock signals such that each flip-flop, of the plurality of flip-flops, switches a flip-flop output signal at the flip-flop output thereof to a reset state from a set state in response to receiving the respective one of the delayed clock signals after a transition of the trigger signal; a clock selection circuit having a first plurality of inputs receiving the delayed clock signals, each of a second plurality of inputs receiving a respective one of the flip-flop output signals, a plurality of feedback outputs, and a selected clock output; the clock selection circuit applying a selected one of the delayed clock signals to the selected clock output and a feedback signal to a selected feedback output of the feedback outputs in response to a first one of the flip-flop output signals switching to the reset state; and feedback means for connecting the feedback outputs to the third input of respective ones of the plurality of flip flops.

According to an embodiment of the present invention, a synchronized clock generating apparatus includes a delayed clock generating circuit; the delayed clock generating circuit including a clock input having a basic clock signal applied thereto; the delayed clock generating circuit including further a plurality of delaying elements connected in series; the plurality of delaying elements being effective for producing a plurality of delayed clock signals each successively delayed relative to the basic clock signal; a plurality of flip-flops, each having a respective one of the plurality of delayed clock signals applied to a first input thereof; the plurality of flip-flops each having a second input with a trigger signal, asynchronous with the basic clock signal, applied thereto; each of the plurality of flip-flops having a third input and a flip-flop output; the plurality of flip-flops receiving the trigger signal and the delayed clock signals such that each flip-flop, of the plurality of flip-flops, switches a flip-flop output signal at the flip-flop output thereof to a reset state from a set state in response to receiving a transition of the respective one of the delayed clock signals after a transition of the trigger signal; a clock selection circuit having a first plurality of inputs receiving the delayed clock signals, each of a second plurality of inputs receiving a respective one of the flip-flop output signals, a plurality of feedback outputs, and a selected clock output; the clock selection circuit applying a first one of the delayed clock signals having a transition after a transition of the trigger signal to the selected clock output and a feedback signal to a selected feedback output of the feedback outputs in response to a first one of the flip-flop output signals switching to the reset state; and feedback means for connecting the feedback outputs to the third input of respective ones of the plurality of flip flops.

According to an embodiment of the invention, a synchronized clock generating apparatus includes a delayed clock generating circuit; the delayed clock generating circuit including a clock input having a basic clock signal applied thereto; the delayed clock generating circuit including further a plurality of delaying elements connected in series; the plurality of delaying elements being effective for producing a plurality of delayed clock signals each successively delayed relative to the basic clock signal; a plurality of flip-flops, each having a respective one of the plurality of delayed clock signals applied to a first input thereof; the plurality of flip-flops each having a second input with a trigger signal, asynchronous with the basic clock signal, applied thereto; each of the plurality of flip-flops having a third input and a flip-flop output; the plurality of flip-flops receiving the trigger signal and the delayed clock signals such that each flip-flop, of the plurality of flip-flops, switches a flip-flop output signal at the flip-flop output thereof to a reset state from a set state in response to receiving a transition of the respective one of the delayed clock signals after a transition of the trigger signal; a clock selection circuit having a first plurality of inputs receiving the delayed clock signals, each of a second plurality of inputs receiving a respective one of the flip-flop output signals, a plurality of feedback outputs, and a selected clock output; the clock selection circuit applying to the selected clock output a selected one of the delayed clock signals and a feedback signal to a selected feedback output of the feedback outputs in response to a first one of the flip-flop output signals switching to the reset state; the selected one of the delayed clock signals having a transition succeeding a first one of the delayed clock signals having a transition after a transition of the trigger signal, by a predetermined period; and feedback means for connecting the feedback outputs to the third input of respective ones of the plurality of flip flops.

According to an embodiment of the invention, a synchronized clock generating apparatus includes a delayed clock generating circuit; the delayed clock generating circuit including a clock input having a basic clock signal applied thereto; the delayed clock generating circuit including further a plurality of delaying elements connected in series; the plurality of delaying elements being effective for producing a plurality of delayed clock signals each successively delayed relative to the basic clock signal; a plurality of flip-flops, each having a respective one of the plurality of delayed clock signals applied to a first input thereof; the plurality of flip-flops each having a second input with a trigger signal, asynchronous with the basic clock signal, applied thereto; each of the plurality of flip-flops having a third input and a flip-flop output; the plurality of flip-flops receiving the trigger signal and the delayed clock signals such that each flip-flop, of the plurality of flip-flops, switches a flip-flop output signal at the flip-flop output thereof to a reset state from a set state in response to receiving a transition of the respective one of the delayed clock signals after a transition of the trigger signal; a clock selection circuit having a first plurality of inputs receiving the delayed clock signals, each of a second plurality of inputs receiving a respective one of the flip-flop output signals, a plurality of feedback outputs, and a selected clock output; the clock selection circuit applying to the selected clock output a selected one of the delayed clock signals and a feedback signal to a selected feedback output of the feedback outputs in response to a first one of the flip-flop output signals switching to the reset state; the selected one of the delayed clock signals having a transition preceding a first one of the delayed clock signals having a transition after a transition of the trigger signal, by a predetermined period; and feedback means for connecting the feedback outputs to the third input of respective ones of the plurality of flip flops.

According to an embodiment of the invention, a synchronized clock generating apparatus includes a delayed clock generating circuit; the delayed clock generating circuit including a clock input having a basic clock signal applied thereto; the delayed clock generating circuit including further a plurality of delaying elements connected in series; the plurality of delaying elements being effective for producing a plurality of delayed clock signals each successively delayed relative to the basic clock signal; a plurality of flip-flops, each having a respective one of the plurality of delayed clock signals applied to a first input thereof; the plurality of flip-flops each having a second input with a trigger signal, asynchronous with the basic clock signal, applied thereto; each of the plurality of flip-flops having a third input and a flip-flop output; the plurality of flip-flops receiving the trigger signal and the delayed clock signals such that each flip-flop, of the plurality of flip-flops, switches a flip-flop output signal at the flip-flop output thereof to a reset state from a set state in response to receiving a transition of the respective one of the delayed clock signals after a transition of the trigger signal; a clock selection circuit having a first plurality of inputs receiving the delayed clock signals, each of a second plurality of inputs receiving a respective one of the flip-flop output signals, a plurality of feedback outputs, and a selected clock output; the clock selection circuit applying to the selected clock output a selected one of the delayed clock signals and a feedback signal to a selected feedback output of the feedback outputs in response to one of the flip-flop output signals switching to the reset state and another one of the flip-flop outputs, preceding the one of the flip-flop output signals, being in the set state; the selected one of the delayed clock signals having a transition with a predetermined relationship to a the one of the delayed clock signals; and feedback means for connecting the feedback outputs to the third input of respective ones of the plurality of flip flops.

According to an embodiment of the invention, a synchronized clock generating apparatus includes a delayed clock generating circuit; the delayed clock generating circuit including a clock input having a basic clock signal applied thereto; the delayed clock generating circuit including further a plurality of delaying elements connected in series; each of the plurality of delaying elements of the delayed clock generating circuit being a semiconductor logic element; the plurality of delaying elements being effective for producing a plurality of delayed clock signals each successively delayed relative to the basic clock signal; a plurality of flip-flops, each having a respective one of the plurality of delayed clock signals applied to a first input thereof; the plurality of flip-flops each having a second input with a trigger signal, asynchronous with the basic clock signal, applied thereto; each of the plurality of flip-flops having a third input and a flip-flop output; the plurality of flip-flops receiving the trigger signal and the delayed clock signals such that each flip-flop, of the plurality of flip-flops, switches a flip-flop output signal at the flip-flop output thereof to a reset state from a set state in response to receiving a transition of the respective one of the delayed clock signals after a transition of the trigger signal; a clock selection circuit having a first plurality of inputs receiving the delayed clock signals, each of a second plurality of inputs receiving a respective one of the flip-flop output signals, a plurality of feedback outputs, and a selected clock output; the clock selection circuit applying to the selected clock output a selected one of the delayed clock signals and a feedback signal to a selected feedback output of the feedback outputs in response to one of the flip-flop output signals switching to the reset state and another one of the flip-flop outputs, preceding the one of the flip-flop output signals, being in the set state; the selected one of the delayed clock signals having a transition with a predetermined relationship to a the one of the delayed clock signals; and feedback means for connecting the feedback outputs to the third input of respective ones of the plurality of flip flops.

According to an embodiment of the invention, a synchronized clock generating apparatus includes a delayed clock generating circuit; the delayed clock generating circuit including a clock input having a basic clock signal applied thereto; the delayed clock generating circuit including further a plurality of delaying elements connected in series; each of the plurality of delaying elements of the delayed clock generating circuit being a semiconductor logic element; the plurality of delaying elements being effective for producing a plurality of delayed clock signals each successively delayed relative to the basic clock signal; a plurality of flip-flops, each having a respective one of the plurality of delayed clock signals applied to a first input thereof; the plurality of flip-flops each having a second input with a trigger signal, asynchronous with the basic clock signal, applied thereto; each of the plurality of flip-flops having a third input and a flip-flop output; the plurality of flip-flops receiving the trigger signal and the delayed clock signals such that each flip-flop, of the plurality of flip-flops, switches a flip-flop output signal at the flip-flop output thereof to a reset state from a set state in response to receiving a transition of the respective one of the delayed clock signals after a transition of the trigger signal; a clock selection circuit having a first plurality of inputs receiving the delayed clock signals, each of a second plurality of inputs receiving a respective one of the flip-flop output signals, a plurality of feedback outputs, and a selected clock output; the clock selection circuit applying a selected one of the delayed clock signals to the selected clock output and a feedback signal to a selected feedback output of the feedback outputs in response to a first one of the flip-flop output signals switching to the reset state; and feedback means for connecting the feedback outputs to the third input of respective ones of the plurality of flip flops.

According to an embodiment of the invention, a synchronized clock generating apparatus includes a delayed clock generating circuit; the delayed clock generating circuit including a clock input having a basic clock signal applied thereto; the delayed clock generating circuit including further a plurality of delaying elements connected in series; each one of the plurality of delaying elements of the delayed clock generating circuit being a semiconductor logic element; the plurality of delaying elements being effective for producing a plurality of delayed clock signals each successively delayed relative to the basic clock signal; a plurality of flip-flops, each having a respective one of the plurality of delayed clock signals applied to a first input thereof; the plurality of flip-flops each having a second input with a trigger signal, asynchronous with the basic clock signal, applied thereto; each of the plurality of flip-flops having a third input and a flip-flop output; the plurality of flip-flops receiving the trigger signal and the delayed clock signals such that each flip-flop, of the plurality of flip-flops, switches a flip-flop output signal at the flip-flop output thereof to a reset state from a set state in response to receiving a transition of the respective one of the delayed clock signals after a transition of the trigger signal; a clock selection circuit having a first plurality of inputs receiving the delayed clock signals, each of a second plurality of inputs receiving a respective one of the flip-flop output signals, a plurality of feedback outputs, and a selected clock output; the clock selection circuit applying a first one of the delayed clock signals having a transition after a transition of the trigger signal to the selected clock output and a feedback signal to a selected feedback output of the feedback outputs in response to a first one of the flip-flop output signals switching to the reset state; and feedback means for connecting the feedback outputs to the third input of respective ones of the plurality of flip flops.

According to an embodiment of the invention, a synchronized clock generating apparatus includes a delayed clock generating circuit; the delayed clock generating circuit including a clock input having a basic clock signal applied thereto; the delayed clock generating circuit including further a plurality of delaying elements connected in series; each one of the plurality of delaying elements of the delayed clock generating circuit being a semiconductor logic element; the plurality of delaying elements being effective for producing a plurality of delayed clock signals each successively delayed relative to the basic clock signal; a plurality of flip-flops, each having a respective one of the plurality of delayed clock signals applied to a first input thereof; the plurality of flip-flops each having a second input with a trigger signal, asynchronous with the basic clock signal, applied thereto; each of the plurality of flip-flops having a third input and a flip-flop output; the plurality of flip-flops receiving the trigger signal and the delayed clock signals such that each flip-flop, of the plurality of flip-flops, switches a flip-flop output signal at the flip-flop output thereof to a reset state from a set state in response to receiving a transition of the respective one of the delayed clock signals after a transition of the trigger signal; a clock selection circuit having a first plurality of inputs receiving the delayed clock signals, each of a second plurality of inputs receiving a respective one of the flip-flop output signals, a plurality of feedback outputs, and a selected clock output; the clock selection circuit applying to the selected clock output a selected one of the delayed clock signals and a feedback signal to a selected feedback output of the feedback outputs in response to a first one of the flip-flop output signals switching to the reset state; the selected one of the delayed clock signals having a transition succeeding a first one of the delayed clock signals having a transition after a transition of the trigger signal, by a predetermined period; and feedback means for connecting the feedback outputs to the third input of respective ones of the plurality of flip flops.

According to an embodiment of the invention, a synchronized clock generating apparatus includes a delayed clock generating circuit; the delayed clock generating circuit including a clock input having a basic clock signal applied thereto; the delayed clock generating circuit including further a plurality of delaying elements connected in series; each one of the plurality of delaying elements of the delayed clock generating circuit being a semiconductor logic element; the plurality of delaying elements being effective for producing a plurality of delayed clock signals each successively delayed relative to the basic clock signal; a plurality of flip-flops, each having a respective one of the plurality of delayed clock signals applied to a first input thereof; the plurality of flip-flops each having a second input with a trigger signal, asynchronous with the basic clock signal, applied thereto; each of the plurality of flip-flops having a third input and a flip-flop output; the plurality of flip-flops receiving the trigger signal and the delayed clock signals such that each flip-flop, of the plurality of flip-flops, switches a flip-flop output signal at the flip-flop output thereof to a reset state from a set state in response to receiving a transition of the respective one of the delayed clock signals after a transition of the trigger signal; a clock selection circuit having a first plurality of inputs receiving the delayed clock signals, each of a second plurality of inputs receiving a respective one of the flip-flop output signals, a plurality of feedback outputs, and a selected clock output; the clock selection circuit applying to the selected clock output a selected one of the delayed clock signals and a feedback signal to a selected feedback output of the feedback outputs in response to a first one of the flip-flop output signals switching to the reset state; the selected one of the delayed clock signals having a transition preceding a first one of the delayed clock signals having a transition after a transition of the trigger signal, by a predetermined period; and feedback means for connecting the feedback outputs to the third input of respective ones of the plurality of flip flops.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Embodiment 1

Figure 1:
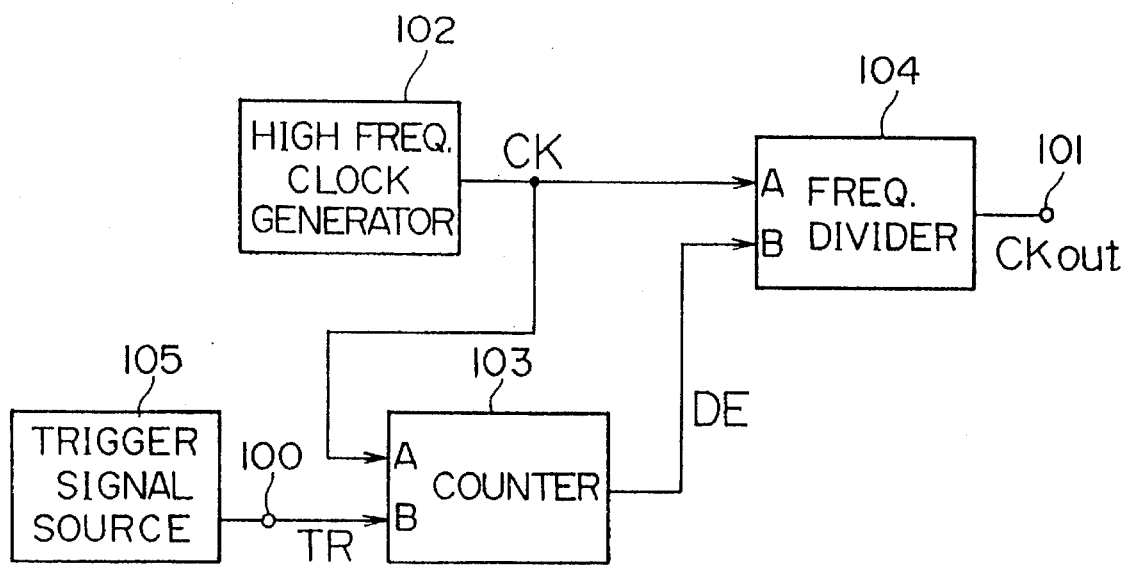
FIG. 1 is a block diagram of an example of a conventional synchronized clock generating apparatus.
Figure 2:
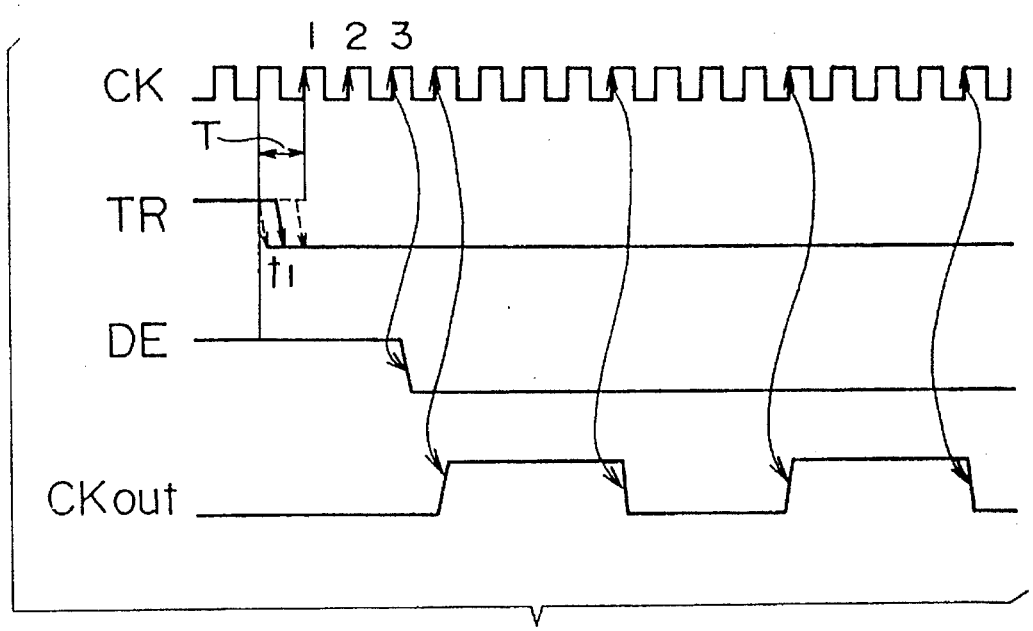
FIG. 2 is a timing diagram for use in explaining the operation of the conventional synchronized clock generating apparatus shown in FIG. 1.
Figure 3:
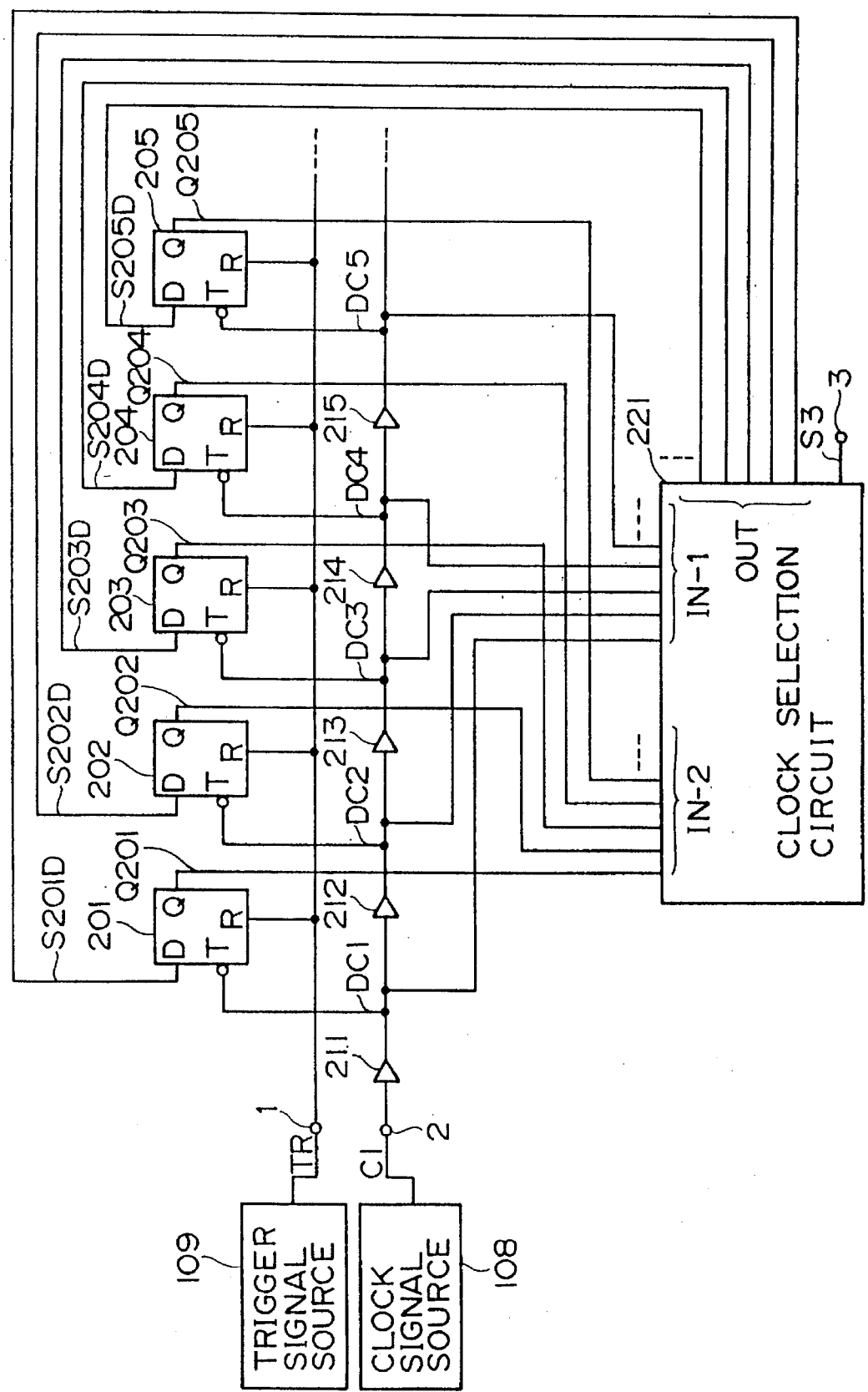
FIG. 3 is a block diagram of a synchronized clock generating apparatus according to one embodiment of the present invention.

Referring to FIG. 3 a synchronized clock C1 generating apparatus according to a first embodiment of the present invention is shown in block form. A basic clock signal C1 applied to a clock input terminal 2 from a clock signal source 108 is coupled to an input terminal of a first delaying element 211 of a delayed-clock generating circuit which includes a plurality of delaying elements in addition to delaying element 211. In FIG. 3, only five such delaying elements 211–215 are shown and described. A delayed clock signal DC1 from delaying element 211 is coupled to delaying element 212 which provides a delayed clock signal DC2. Similarly, output delayed signals DC2, DC3, DC4, and DC5 from their respective delaying elements 212, 213, 214, and 215 are applied to the inputs of succeeding ones of the delaying elements. The delaying elements may be buffer amplifiers, for example.

The output delayed clock signal DC1 from delaying element 211 is applied to a negative-logic clock input terminal T of a flip-flop 201. The output delayed clock signal DC2 from delaying element 212 is applied to a negative-logic clock input terminal T of a flip-flop 202. In a similar manner, output delayed clock signals DC3, DC4, and DC5 from respective delaying elements 213, 214, and 215 are applied to negative-logic clock input terminals T of flip-flops 203, 204, and 205, respectively. The delayed clock signals DC1–DC5 are also applied to one set of input terminals IN-1 of a clock selection circuit 221.

An asynchronous trigger signal TR is applied from a trigger signal source 109 through a trigger signal input terminal 1 to RESET input terminals R of the respective flip-flops 201–205. Output signals Q201–Q205 from data output terminals Q of respective flip-flops 201–205 are applied to another set of input terminals IN-2 of clock selection circuit 221. Further, output signals S201D–S205D at output terminals OUT of clock selection circuit 221 are coupled to DATA input terminals D of flip-flops 201–205, respectively.

As stated previously, there may be more delaying elements and flip-flops than shown in FIG. 3, but delaying elements succeeding delaying element 215 and flip-flops succeeding flip-flop 205 are not shown or described.

Figure 4:
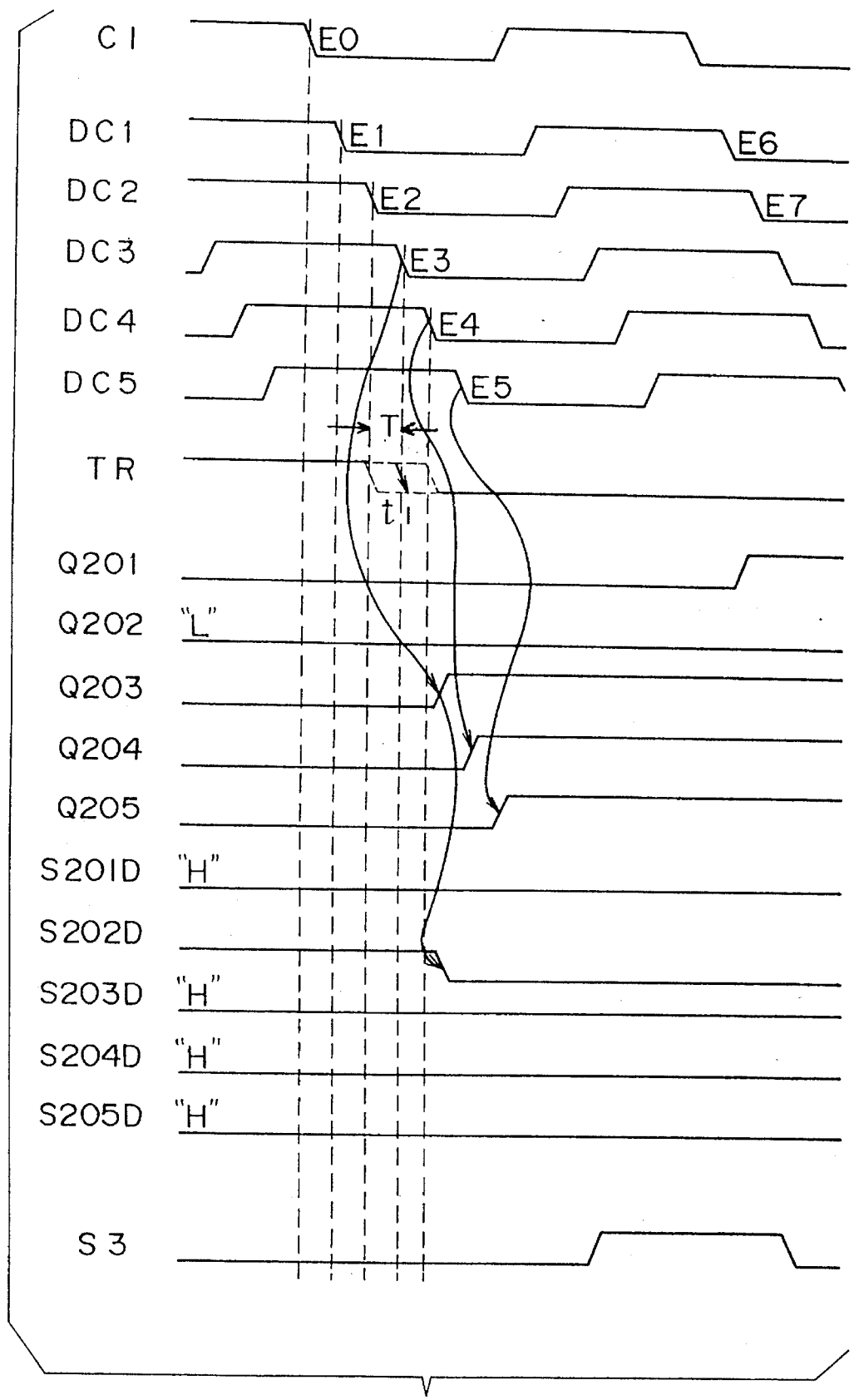
FIG. 4 is a timing diagram for use in explaining the operation of the synchronized clock generating apparatus shown in FIG. 3.

Next, the operation of the circuit shown in FIG. 3 is described. FIG. 4 is a timing chart for use in explaining the operation of the circuit of FIG. 3. As shown in FIG. 4, basic clock signal C1 is successively delayed by delaying elements 211–215 by a predetermined time so that delayed clock signals DC1–DC5 are provided.

Now, let it be assumed that a transition from the "H" level to the "L" level occurs in trigger signal TR at a time $t_1$ as shown. This transition places RESET input terminals R of flip-flops 201–205 at the "L" level so as to enable the flip-flops. Flip-flops 201–205 start accepting data upon receiving falling edges of the clock signals applied to their respective clock signal input terminals T. When falling edges E1 and E2 occurred in delayed clock signals DC1 and DC2, respectively, from delaying elements 211 and 212, trigger signal TR was still at the "H" level, and therefore, flip-flops 201 and 202 could not operate. Flip-flops 201 and 202 operate when next falling edges E6 and E7 occur in delayed clock signals DC1 and DC2, respectively. Flip-flops 201 and 202 provide the levels of the signals present at respective DATA input terminals D at the times of the occurrence of edges E6 and E7 to their own outputs Q as their output signals Q201 and Q202, respectively. As will be explained later, the DATA input terminals D of flip-flops 201 and 202 at the occurrence of the edges E6 and E7 are at the "H" and "L" levels, respectively.

When falling edges E3, E4, and E5 occur in delayed clock signals DC3, DC4, and DC5 from delaying elements 213, 214, and 215, respectively, trigger signal TR is at the "L" level. Flip-flops 203, 204, and 205 provide the levels present at their respective DATA input terminals D at the occurrence of the respective falling edges E3, E4, and E5 to their output terminals Q, as output signals Q203, Q204, and Q205, respectively. As will be explained later, since input signals S201D–S205D applied from clock selection circuit 221 to DATA input terminals D of flip-flops 201–205, respectively, are initially all at the "H" level, output signals Q203–Q205 of flip-flops 203–205 are at the "H" level.

Clock selection circuit 221 detects the delayed clock signal corresponding to that one of the output signals Q201–Q205 of flip-flops 201–205 which rises earliest in time, that is, that one of the delayed clock signals DC1–DC5 which has a rising edge closest in time to the falling edge of the trigger signal TR. For example, each delayed clock signal DC3 in the embodiment shown in FIGS. 3–4 is such a signal. The clock selection circuit 221 selects a desired one of the delayed clock signals DC1–DC5 (DC3 in the embodiment shown in FIGS. 3–4) in accordance with the detected delayed clock signal, providing it as a synchronized clock signal S3 from a synchronized clock output terminal 3. Furthermore, clock selection circuit 221 sets the levels at DATA input terminals D of flip-flops 201–205 to maintain the selected condition. Clock selection circuit 221 is described in detail later.

Embodiment 2

Figure 4A:
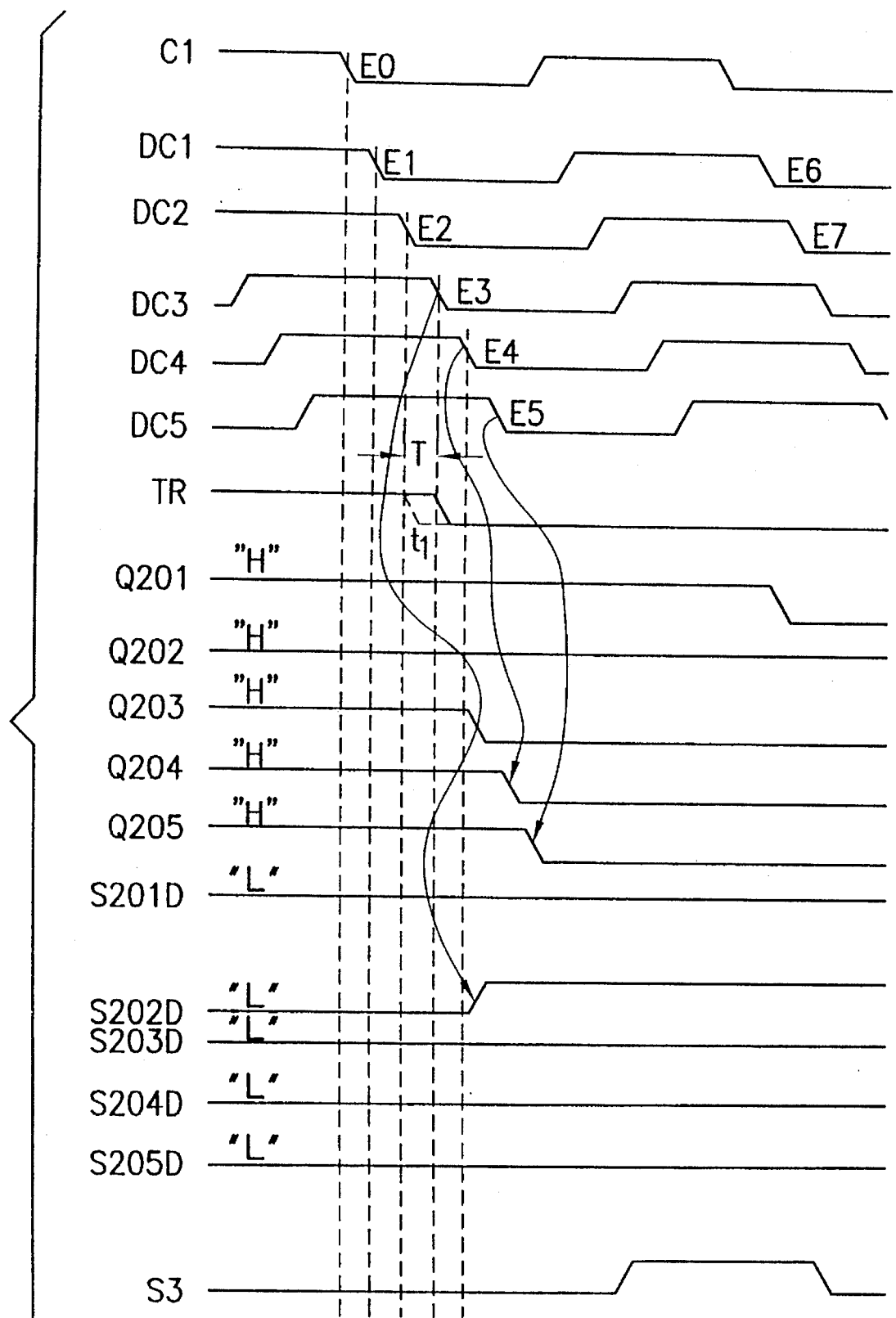
FIG. 4(a) is a timing diagram for use in explaining the operation of the synchronized clock generating apparatus shown in FIG. 5.
Figure 5:
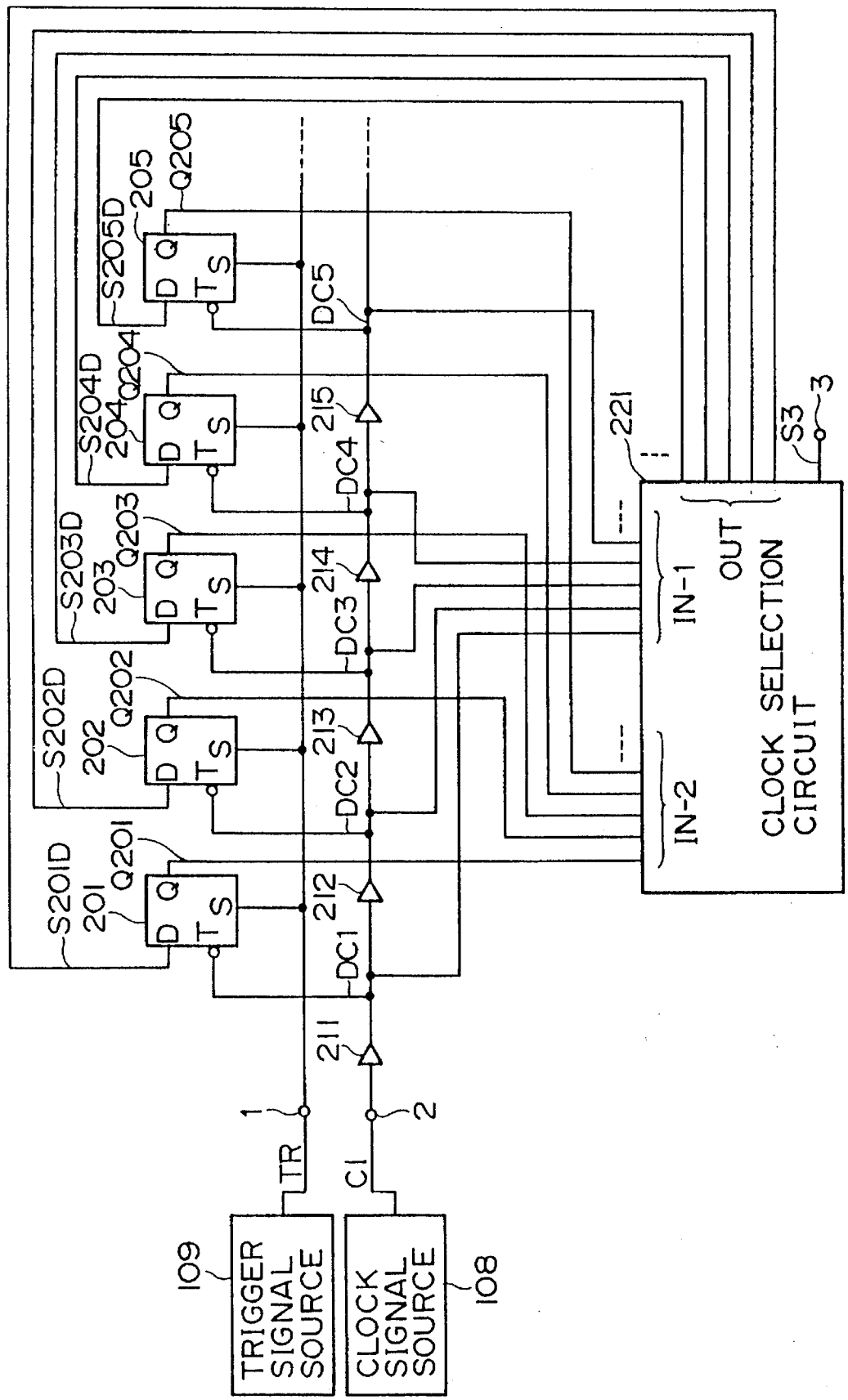
FIG. 5 is a block diagram of a synchronized clock generating apparatus according to a second embodiment of the present invention.

Referring to FIG. 5, a synchronized clock generating apparatus according to a second embodiment of the present invention is shown. The synchronized clock generating apparatus according to the second embodiment is similar to the apparatus of the first embodiment, except that the asynchronous trigger signal TR is applied to SET input terminals S rather than to the RESET input terminals of the respective flip-flops 201–205. Another difference between the first and second embodiments is that the output signals appearing at the set of output terminals OUT of the clock selection circuit 221 in the second embodiment are polarity-inverted versions of the output signals S201D–S205D shown in FIG. 4. FIG. 4(a) shows the timing diagram for the second embodiment. A further difference between the first and second embodiments is that in the second embodiment, the output signals of flip-flops 201–205 are polarity-inverted versions of the output signals Q201–Q205 shown in FIG. 4. Accordingly, in FIG. 5, the same reference numerals and symbols represent components and functions equivalent to those shown in FIG. 3, and further description is omitted.

In the first and second embodiments shown in FIGS. 3 and 5, even if the time of triggering by the asynchronous trigger signal varies within a range T, indicated by broken lines in FIGS. 4 and 4(a), the states of the output signals Q201–Q205 of the flip-flops 201–205 will not change, whereby the synchronized clock signal S3 appears at a fixed time. In other words, the synchronization precision of the apparatus can be approximated to the time delay provided by one delaying element, 211–215, or it may be expressed approximately as: Synchronization Precision=Delay Time Provided by One Delaying Element. In the field of semiconductor integrated circuits, it is easy to set the delay time provided by one delaying element to 1 ns or less, so that the present invention provides a considerably higher synchronization precision than conventional circuits.

Figure 6:
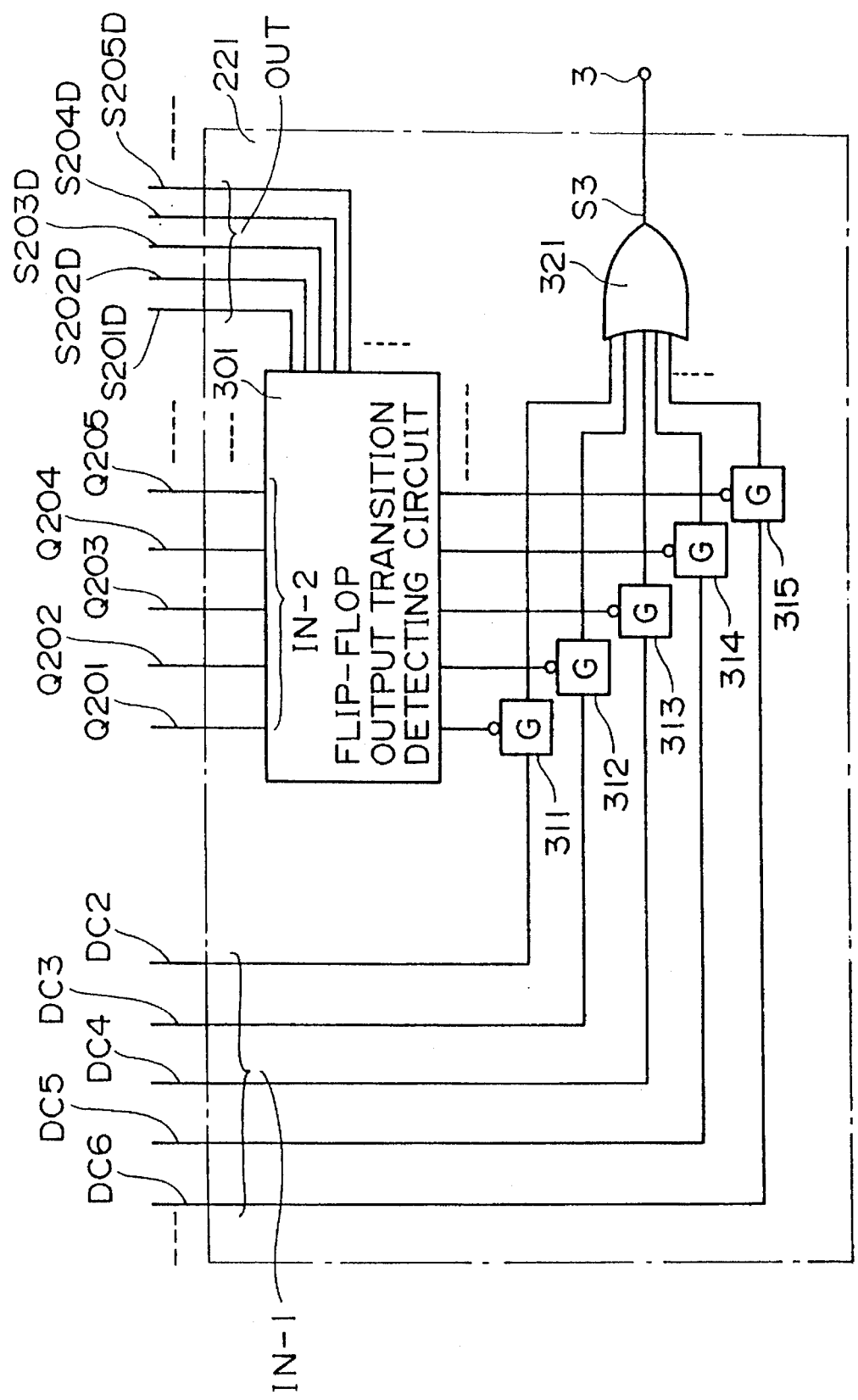
FIG. 6 shows an example of a clock selection circuit usable in the synchronized clock generating apparatus shown in FIGS. 3 and 5.

FIG. 6 is a circuit diagram of an example of the clock selection circuit 221 usable in the synchronized clock generating apparatus of FIGS. 3 and 5. As shown in FIG. 6, output signals Q201–Q205 of flip-flops 201–205 are applied via a set of input terminals IN-2 of clock selection circuit 221 to a flip-flop output transition detecting circuit 301. The outputs of the flip-flop output transition detecting circuit 301 are connected to respective gate terminals G for controlling the conduction of switches 311–315. The output delayed clock signals DC2–DC6 (DC6 is not shown in FIG. 4) of the delaying elements 212–216 (216 is not shown in FIGS. 3 and 5) are applied respectively through a set of input terminals IN-1 to the input terminals of the switches 311–315, and the respective output terminals of the switches 311–315 are connected to the inputs of a multiple-input OR circuit 321. The output of the multiple-input OR circuit 321 is connected to the synchronized clock signal output terminal 3. The output signals S201D–S205D of the flip-flop transition detecting circuit 301 are returned to the DATA input terminals D of the flip-flops 201–205 shown in FIGS. 3 or 5.

Figure 7:
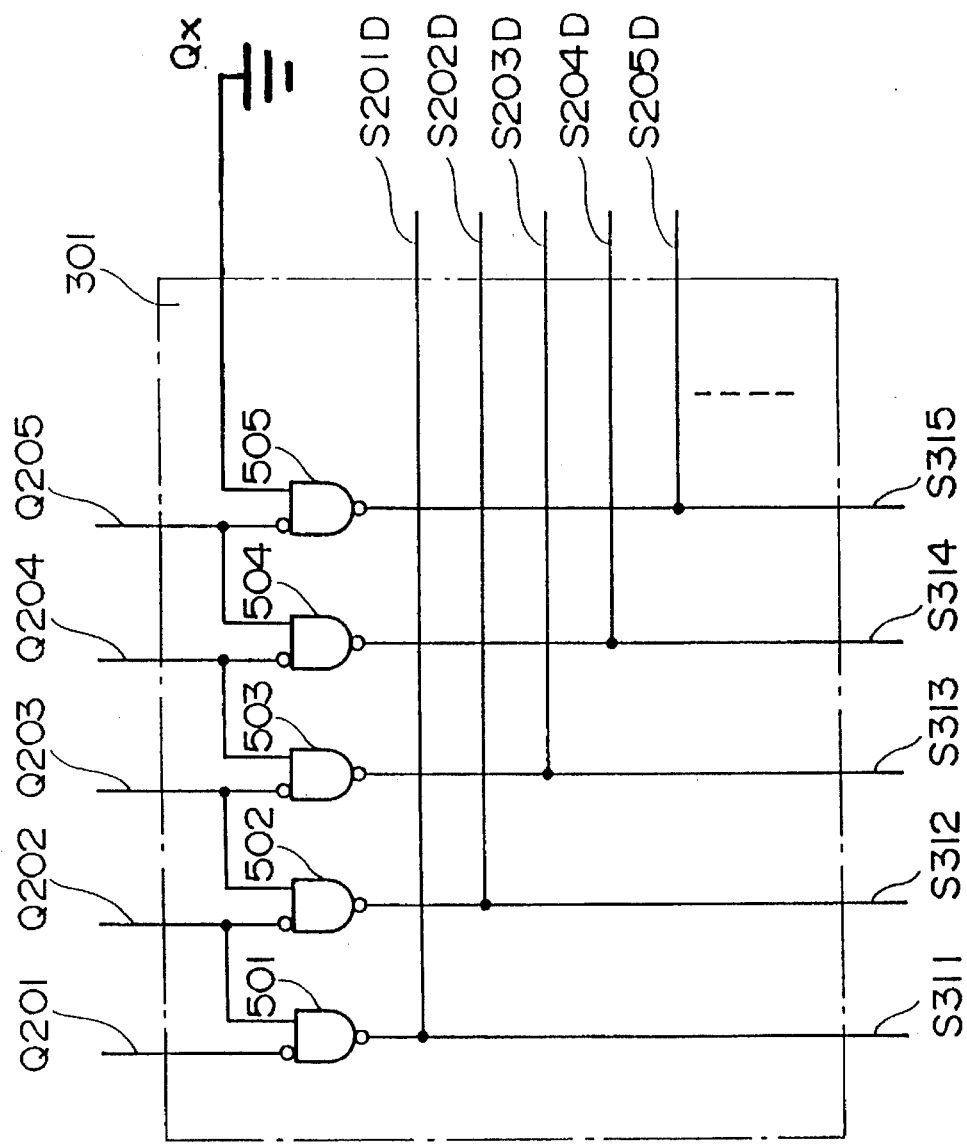
FIG. 7 shows an example of a circuit for detecting changes in output of flip-flops of the clock selection circuit shown in FIG. 6.

FIG. 7 is a circuit diagram of one example of the flip-flop output transition detecting circuit 301 which is a part of the clock selection circuit 221 in the embodiment shown in FIG. 3. The output signal of one of two adjacent ones of the flip-flops 201–205 is inverted, while the output signal of the other is non-inverted, and they are applied to the associated ones of NAND circuits 501–505. When one of the signals applied to each NAND circuit is at the "L" level and the other is at the "H" level, that NAND circuit produces an output signal at the "L" level. Otherwise, it produces an output signal at the "H" level. These output signals S311–S315 of the NAND circuits 501–505 are applied to the DATA input terminals D of the associated ones of the flip-flops 201–205 of FIG. 3, as the previously stated signals S201D–S205D.

Figure 6A:
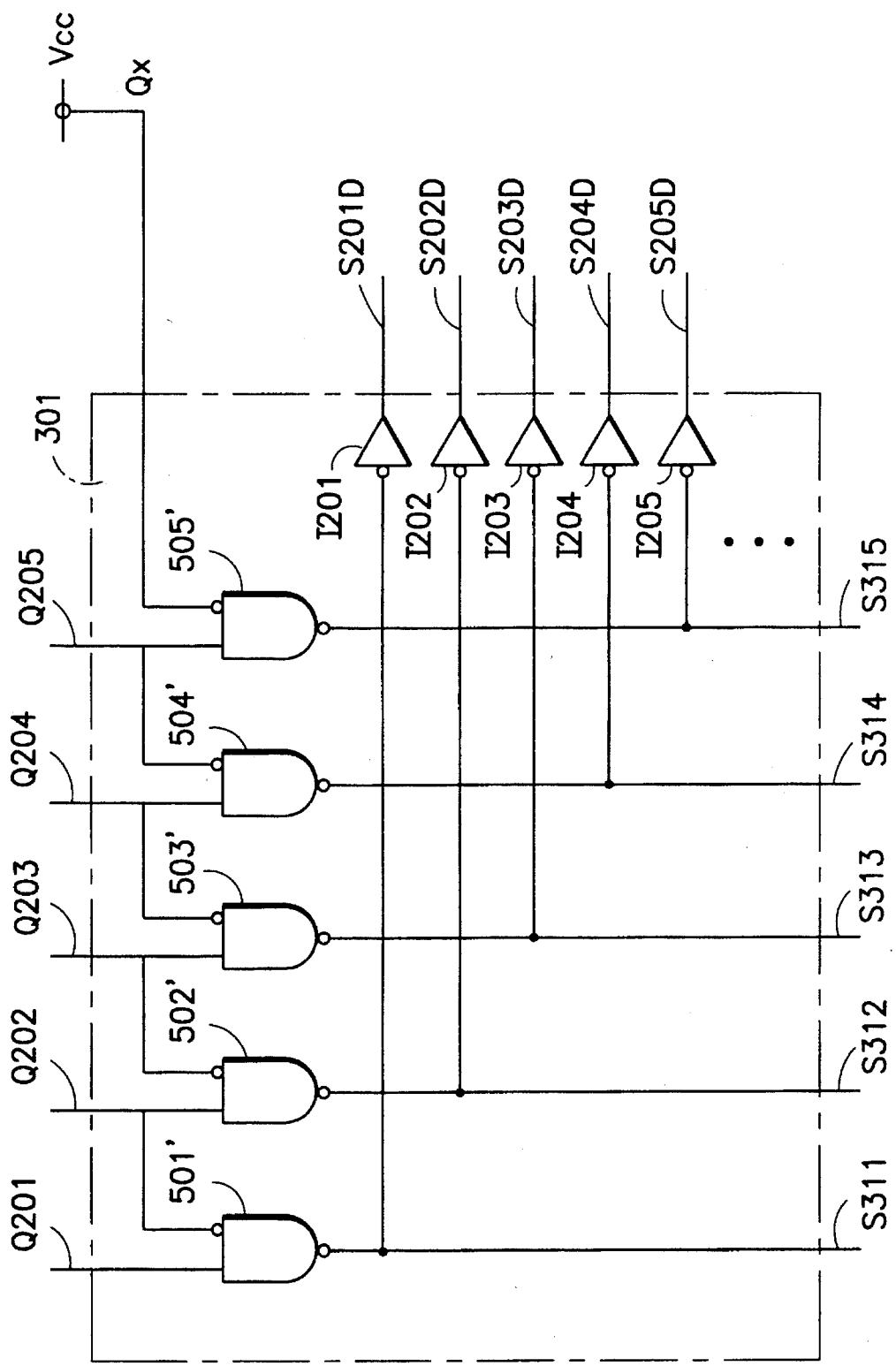
FIG. 6(a) shows an example of a circuit usable in the synchronized clock generating apparatus shown in FIG. 5 for detecting changes in output of flip-flops of the clock selection circuit shown in FIG. 6.

Referring to FIG. 6(a), a circuit diagram of one example of the flip-flop output transition detecting circuit 301 is shown which is a part of the clock selection circuit 221 in the embodiment shown in FIG. 5. Signals S311–S315 are inverted and then applied to the DATA input terminals of flip-flops 201–205 as signals S201D–S205D.

Now the operation of the clock selection circuit 221 shown in FIG. 6 and the operation of the flip-flop output transition detecting circuit 301 shown in FIG. 7 are described. In the flip-flop output transition detecting circuit 301, one of the output signals of two adjacent ones of the flip-flops 201–205, after being inverted, and the other of the two output signals as it is, are compared in an associated one of the NAND circuits 501–505. Only one of the NAND circuits 501–505 that receives a signal at the "L" level and a signal at the "H" level produces an "L" level output signal. (It should be noted that initially all of the output signals S311–S315 of the NAND circuits 501–505 are at the "H" level.) The "L" level output signal renders conductive that one of the switches 311–315 to which it is applied. In the example shown in FIG. 4, the NAND circuit 502 provides the output signal S312 at the "L" level, which signal turns on the switch 312. When one of the switches 311–315 shown in FIG. 6 becomes conductive, the corresponding one of the delayed clock signals DC1–DC5 (the delayed clock signal DC3 in the example shown in FIG. 4) is applied through the conducting switch to the input of the OR circuit 321, appearing at the output of the OR circuit 321 as the synchronized clock signal S3. It is then applied to synchronized clock output terminal 3.

The output from NAND circuit 502 associated with conductive switch 312 changes to the "L" level in response to the change of output Q203 of flip-flop 203 to the "H" level, and the output is returned as the signal S202D to DATA input terminal D of flip-flop 202. Therefore, even when the next falling edge E7 occurs in the delayed clock signal DC2 as shown in FIG. 4, output signal Q202 of flip-flop 202 remains at the "L" level, and the output of the NAND circuit 502 remains at the "L" level.

Figure 8:
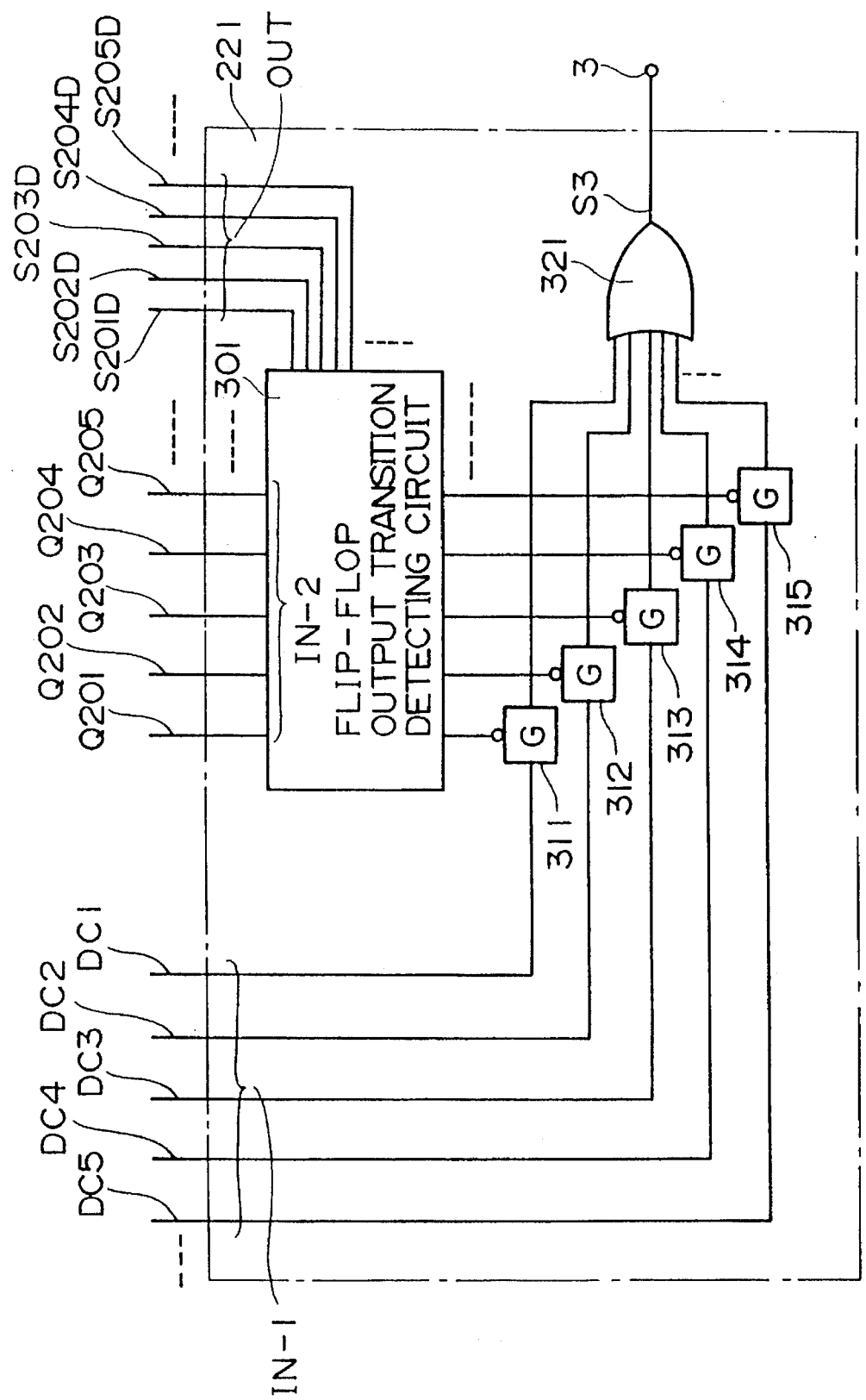
FIG. 8 shows another example of a clock selection circuit usable in the synchronized clock generating apparatus shown in FIGS. 3 and 5.

FIG. 8 shows another example of the clock selection circuit. This circuit differs from the circuit shown in FIG. 6 in the manner of coupling of the delayed clock signals to the switches. More specifically, the delayed clock signals DC1–DC5 are coupled to the input terminals of the respective switches 311–315. The remaining portion of the clock selection circuit of FIG. 8 is the same as the circuit of FIG. 6.

In the clock selection circuit shown in FIG. 8, the synchronized clock signal S3 developed at the synchronized clock output terminal 3 differs from the signal S3 provided from the circuit of FIG. 6 under the same timing condition. For example, under the condition where the delayed clock signal DC2 is selected by the circuit of FIG. 6, the delayed clock signal DC1 is selected by the circuit of FIG. 8. In contrast to the delayed clock signal DC3 selected by the FIG. 6 circuit, the delayed clock signal DC2 is selected by the circuit of FIG. 8. Similarly, the delayed clock signal developed at the synchronized clock output terminal 3 as the synchronized clock signal S3 can be shifted by one. Thus, by changing the coupling between the delayed clock signals and the switches, a desired one of the delayed clock signals can be derived as the synchronized clock signal S3 at the synchronized clock output terminal 3.

The circuit shown in FIG. 6 cannot select the output delayed clock signal DC1 of the first delaying element 211 as the synchronized clock signal S3, while the circuit shown in FIG. 8 cannot select the delayed clock signal from the last delaying element. However, the circuit of FIG. 6 can be arranged to select a delayed clock signal as the synchronized clock signal S3 which is in phase with the delayed clock signal DC1 by using a number of delaying elements to impart to basic clock signal C1 an amount of delay equal to longer than one period of the clock signal so that such an in-phase dock signal appears after the delayed clock signal DCS. Also, in the circuit shown in FIG. 8, by using a number of delaying elements to impart an amount of delay greater than one period of the basic clock signal C1 so that a delayed clock signal which is in phase with the delayed clock signal provided by the last delaying element can appear before the delayed clock signal from the last delaying element, the delayed clock signal, which is in phase with the last delayed clock signal, can be selected as the synchronized clock signal S3.

In the embodiments described thus far, the effective edge of the clock signals at the clock input terminals T of the flip-flops 201–205 is described as a negative-going edge, but a positive-going edge can be used instead. Furthermore, the coupling of the delayed clock signals to the switches is not limited to the circuits shown in FIGS. 6 and 8.

In the embodiments thus far described, a desired delayed clock signal is selected as the synchronized clock pulse output, using that delayed clock signal which has a transition (edge) occurring after and closest in time to a transition (edge) in trigger signal TR applied to asynchronous trigger signal input terminal 1. However, a delayed clock signal having a transition occurring before and closest in time to a transition in the asynchronous trigger signal TR may be used in selecting a desired delayed clock signal as the synchronized clock signal S3. Alternatively, any delayed clock signal occurring closest in time to a transition in the asynchronous trigger signal TR, regardless of whether it occurs before or after the trigger signal transition, may be used in selecting a desired delayed clock signal as the synchronized clock signal S3.

Embodiment 3

Figure 9:
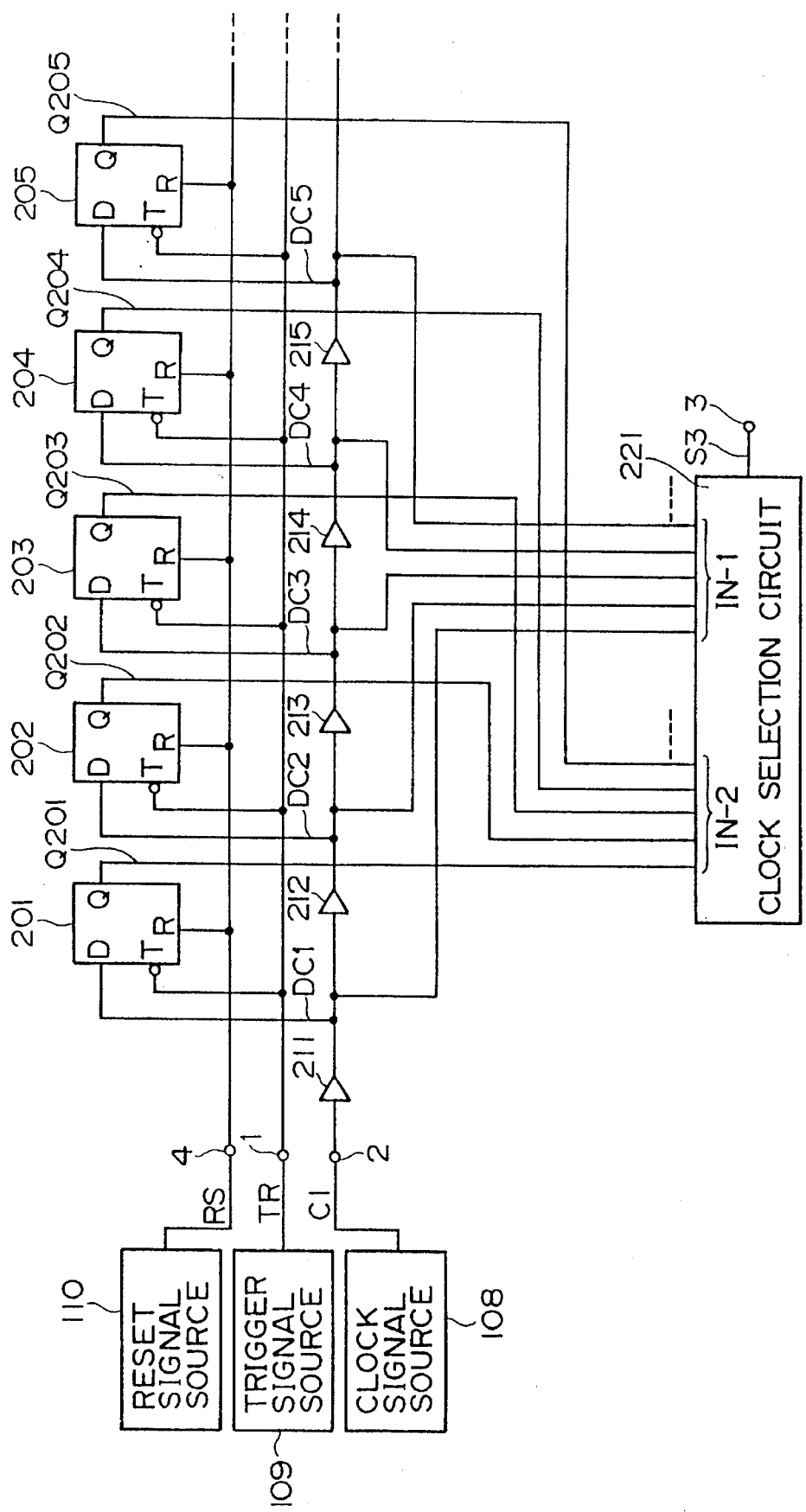
FIG. 9 is a block diagram of a synchronized clock generating apparatus according to a third embodiment of the present invention.

FIG. 9 is a block diagram of a synchronized clock generating apparatus according to a third embodiment of the present invention. A basic clock signal C1 applied at a basic clock input terminal 2 from a clock signal source 108 is fed to the input of a first-stage delaying element 211 of a delayed clock generating circuit. An output delayed clock signal DC1 of delaying element 211 is applied to the input of a next-stage delaying element 212, and so on. Thus, the basic clock signal C1 at input terminal 2 is delayed successively by delaying elements 211–215 of the delayed clock generating circuit.

Delayed clock signal DC1 from delaying element 211 is applied to a DATA input terminal D of a flip-flop 201, and a delayed clock signal DC2, which is an output of next-stage delaying element 212, is applied to a DATA input terminal D of a flip-flop 202. Similarly, output delayed clock signals DC1–DC5 from the respective delaying elements 211–215 are applied to the DATA input terminals of their associated flip-flops 201–205. The delayed clock signals DC1–DC5 are also applied to a set of input terminals IN-1 of a clock selection circuit 221.

An asynchronous trigger signal TR applied to a trigger signal input terminal 1 from a trigger signal source 109 is fed to a negative-logic CLOCK input terminal T of each of flip-flops 201–205. A reset signal RS at a reset signal input terminal 4 applied from a reset signal source 110 is fed to a RESET input terminal R of each of flip-flops 201–205. The output signals Q201–Q205 from the DATA output terminals Q of flip-flops 201–205 are applied to another set of input terminals IN-2 of the clock selection circuit 221.

In FIG. 9, more delaying elements and flip-flops than shown may be used, but delaying elements succeeding the delaying element 215 and flip-flops succeeding the flip-flop 205 are not shown.

Figure 10:
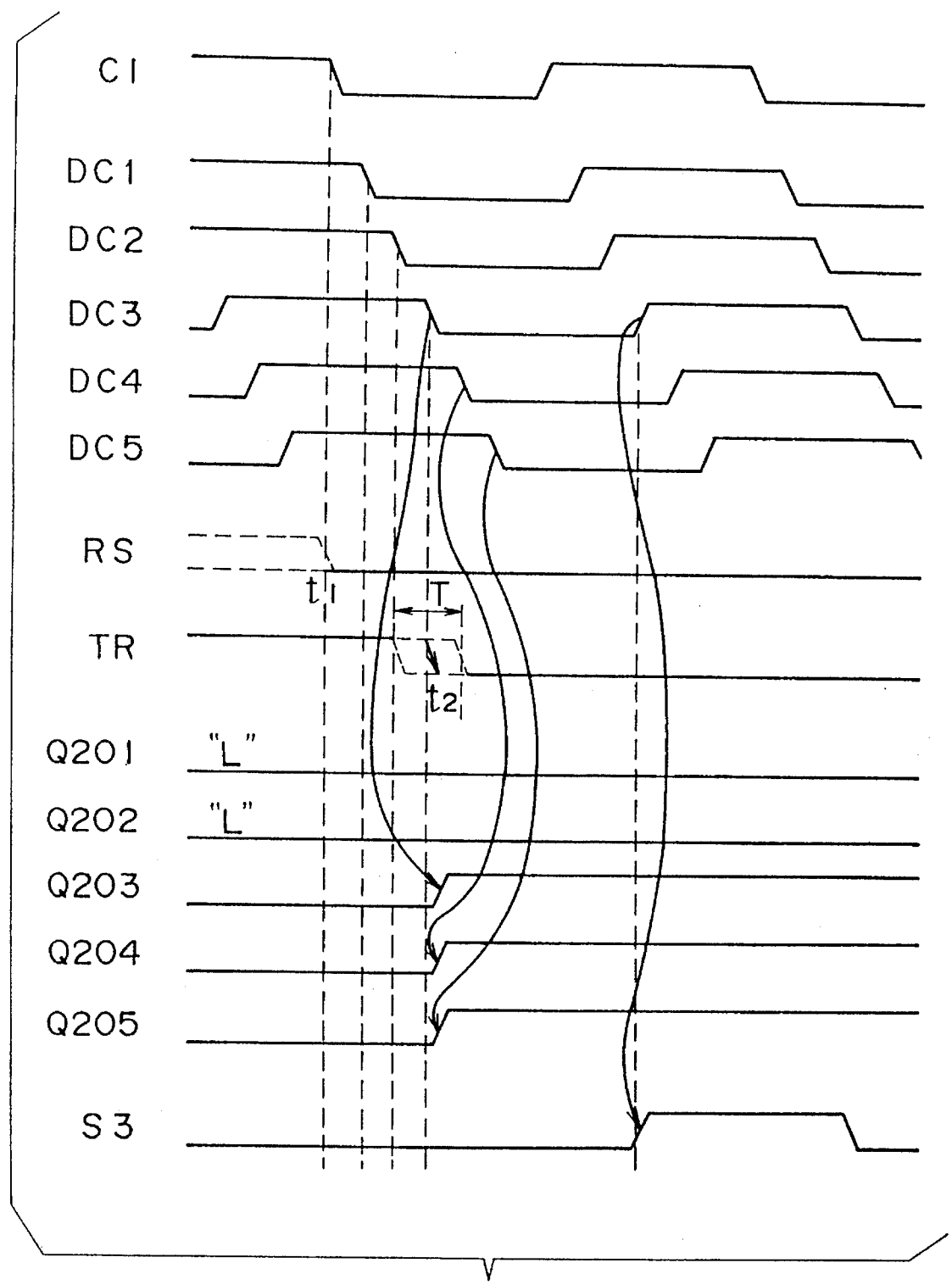
FIG. 10 is a timing diagram for use in explaining the operation of the synchronized clock generating apparatus shown in FIG. 9.

Referring to FIG. 10, the operation of the apparatus shown in FIG. 9 is described. FIG. 10 is a timing chart illustrating the operation of the FIG. 9 apparatus. Basic clock signal C1 is successively delayed by delaying elements 211–215 by a predetermined amount so that delayed clock signals DC1–DC5 are produced. Flip-flops 201–205 are enabled when the reset signal RS falls to the "L" level at a time $t_1$ so that the RESET input terminals R of the flip-flops 201–205 are set to the "L" level.

As shown in FIG. 10, when a transition from the "H" level to the "L" level occurs in the asynchronous trigger signal TR, the respective flip-flops 201–205 accept data currently present at their DATA input terminals D. At that time, delayed clock signals DC1 and DC2, which are outputs of delaying elements 211 and 212, are at the "L" level, and delayed clock signals DC3, DC4, and DC5, which are outputs of the delaying elements 213, 214, and 215, are at the "H" level. Accordingly, output signals Q201–Q205 of flip-flops 201–205 are as shown in FIG. 10.

Clock selection circuit 221 detects one of the delayed clock signals DC1–DC5 which corresponds either to that one of the output signals Q201–Q205 of flip-flops 201–205 which has the earliest positive-going transition, or to that one of the delayed clock signals which has the transition closest in time to the transition in asynchronous trigger signal TR. In the embodiment shown in FIGS. 9 and 10, the delayed clock signal to be selected is the delayed clock signal DC3. Then, using the detected delayed clock signal, clock selection circuit 221 selects a desired one of delayed clock signals DC1–DC5 and provides it as a synchronized clock signal S3 at its synchronized clock output terminal 3. The delayed clock signal selected as the synchronized clock signal S3 is clock signal DC3 in the embodiment shown in FIGS. 9 and 10. Clock selection circuit 221 will be described in detail later.

In the embodiment shown in FIGS. 9 and 10, even if the transition in the asynchronous trigger signal TR varies in time within a range T indicated by broken lines in FIG. 10, the states of the output signals Q201–Q205 of flip-flops 201–205 do not change, so the synchronous clock signal S3 can be provided in the same interval. The precision of synchronization can be approximated to an amount of delay provided by one delaying element, 211–215. That is, the precision of synchronization may be approximately expressed as: Synchronization Precision= Delay Time Provided by One Delaying Element. In the field of semiconductor integrated circuits, it is easy to set a delay time provided by one delaying element to be 1 ns or less, so that a considerably higher synchronization precision is provided by the apparatus of the present invention than by conventional circuits.

Figure 11:
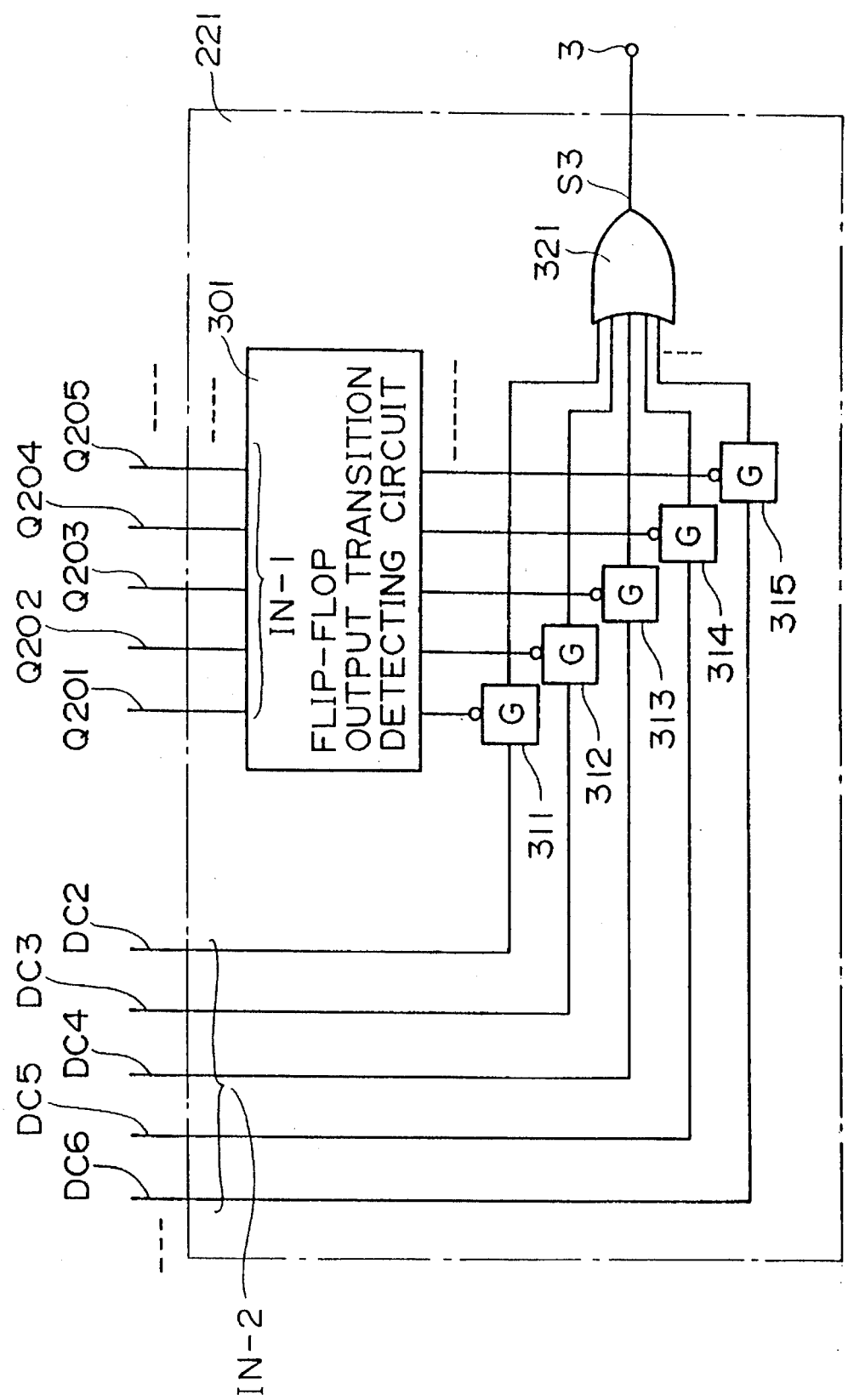
FIG. 11 shows an example of a clock selection circuit usable in the synchronized clock generating apparatus shown in FIG. 9.

FIG. 11 is a circuit diagram showing one example of a clock selection circuit 221 usable in the synchronized clock generating apparatus according to the third embodiment shown in FIG. 9. As shown in FIG. 11, output signals Q201–Q205 from flip-flops 201–205 applied to a set of input terminals IN-1 of clock selection circuit 221 are coupled to a flip-flop output transition detecting circuit 301 of which outputs are coupled to gate terminals G of switches 311–315 for controlling the conduction thereof. The delayed clock signals DC2–DC6, which are the outputs of delaying elements 212–216 (delaying element 216 is not shown in FIG. 9), are applied through a set of input terminals IN-2 to the input terminals of the switches 311–315. Switches 311–315 have their respective outputs coupled to inputs of a multiple-input OR circuit 321, which in turn has its output connected to synchronized clock output terminal 3.

Figure 12:
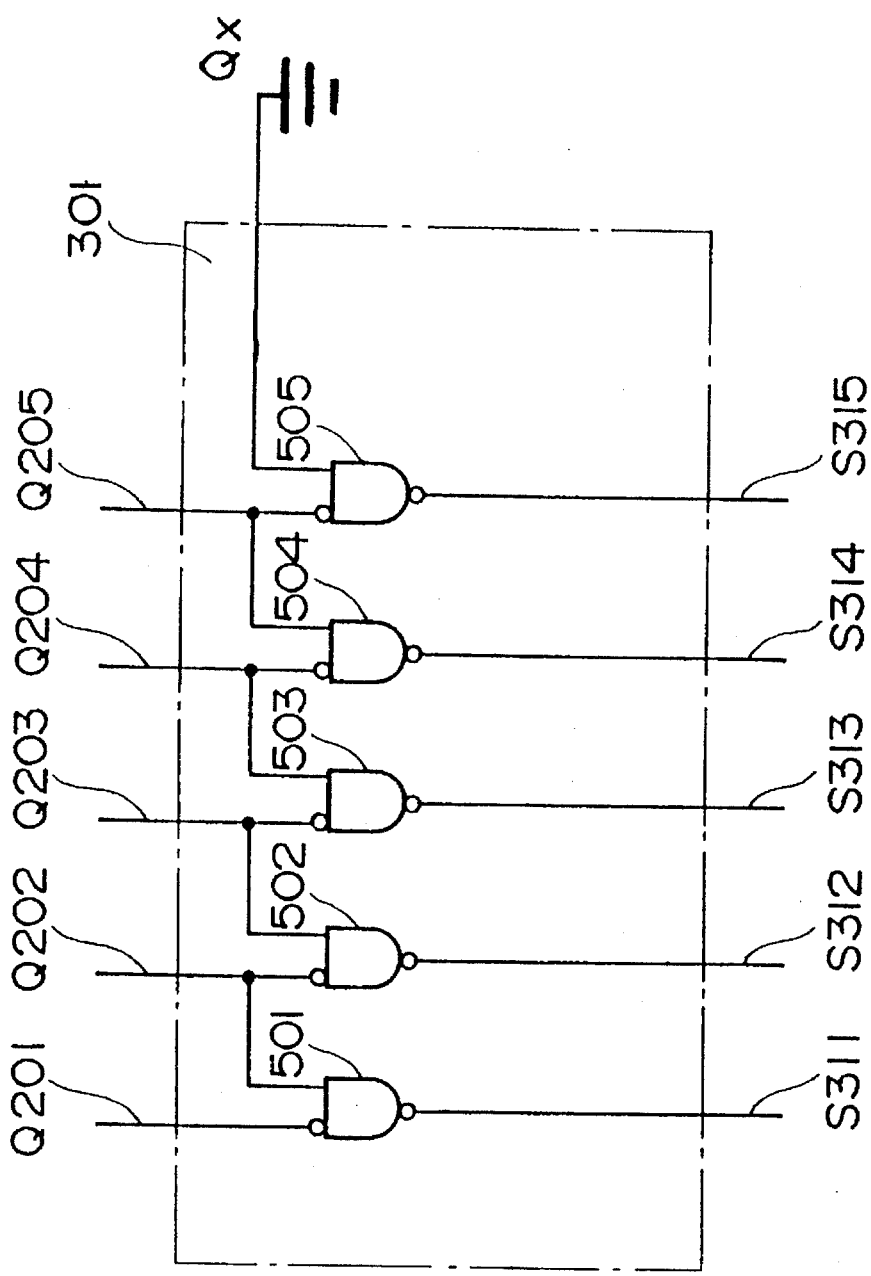
FIG. 12 shows an example of a circuit for detecting changes in output of flip-flops of the clock selection circuit shown in FIG. 11.

FIG. 12 is a circuit diagram of an example of a flip-flop output transition detecting circuit 301 which is part of the clock selection circuit 221 shown in FIG. 11. As shown in FIG. 12, the output signals from two adjacent ones of flip-flops 201–205 are applied to associated ones of NAND circuits 501–505, with one output signal being inverted and the other being uninverted. The NAND circuits develop respective output signals S311–S315 which are normally at the "H" level unless the levels of the two inputs to it are "L" and "H", respectively, at which time the output goes to the "L" level.

Now the operations of the clock selection circuit shown in FIG. 11 and flip-flop output transition detecting circuit 301 shown in FIG. 12 are described. Flip-flop output detecting circuit 301 compares inverted and uninverted outputs from two adjacent ones of flip-flops 201–205 by means of the associated ones of the NAND circuits 501–505. One of the NAND circuits 501–505 develops the "L" level signal when it receives "L" and "H" level input signals. The "L" level signal thus developed renders conductive an associated one of the switches 311–315. In the example of which the timing chart is shown in FIG. 10, when Q202 and Q203 are at the "L" and "H" levels, respectively, the output signal S312 of the NAND circuit 502 is at the "L" level so that the associated switch 312 shown in FIG. 11 becomes conductive. When one of the switches 311–315 becomes conductive, an associated one of the delayed clock signals DC2–DC6 (the delayed clock signal DC3 in the example shown in FIG. 10) is coupled via the conductive switch to an input of a multiple-input OR circuit 321, and multiple-input OR circuit 321 provides the received delayed clock signal as the synchronized clock signal S3 at synchronized signal output terminal 3.

Figure 13:
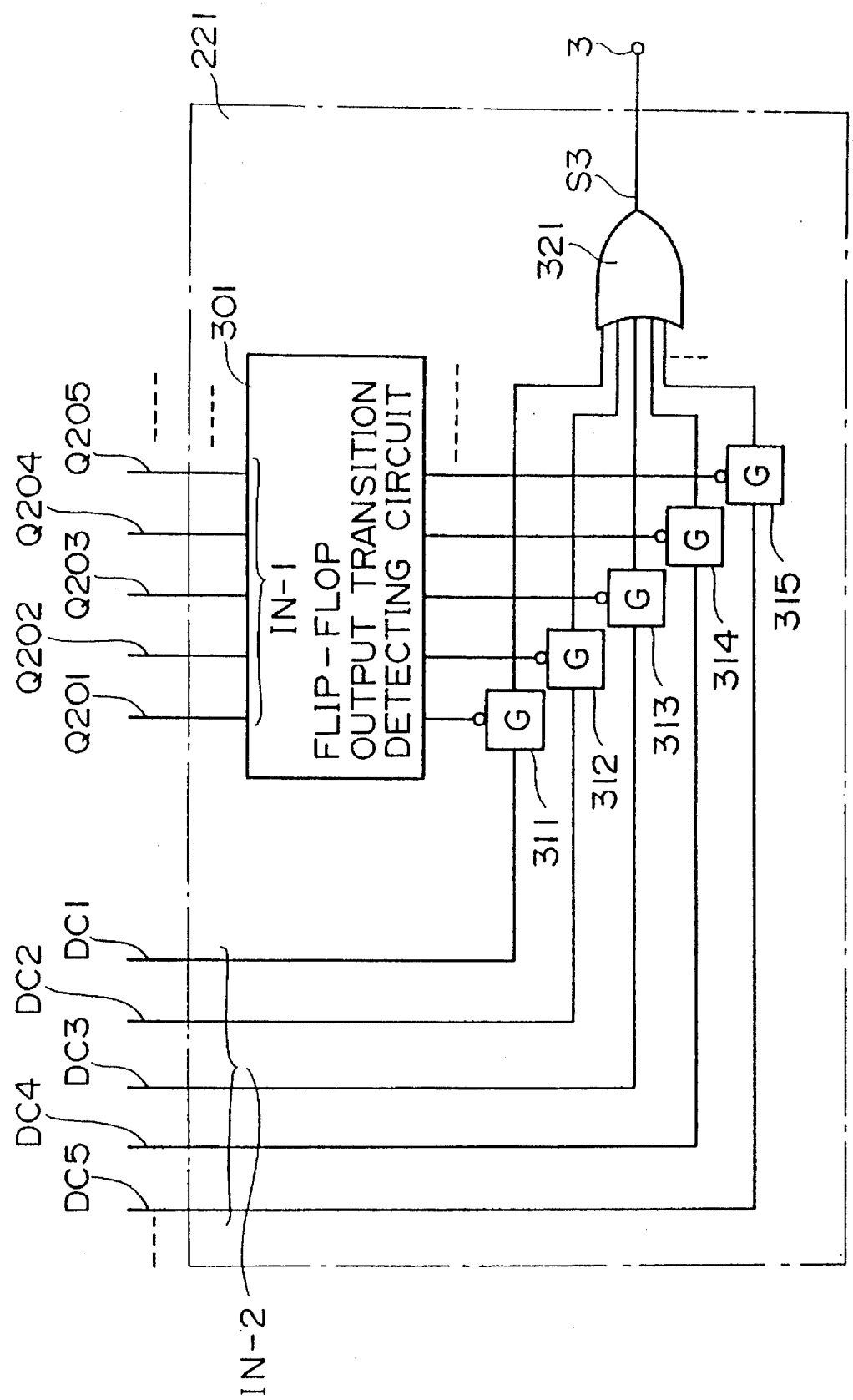
FIG. 13 shows another example of a clock selection circuit usable in the synchronized clock generating apparatus shown in FIG. 9.

FIG. 13 is a circuit diagram of another example of the clock selection circuit usable in the synchronized clock generating apparatus according to the third embodiment shown in FIG. 9. In this example, delayed clock signals DC1–DC5 are applied to the inputs of the respective switches 311–315. The remainder of the circuit shown in FIG. 13 is similar to that of the circuit shown in FIG. 11.

The clock selection circuit shown in FIG. 13 provides a different signal as the synchronized clock signal S3 at output terminal 3 than the circuit shown in FIG. 11 under the same timing condition. For example, under the timing condition for the synchronized clock signal DC3 to be selected in the example of FIG. 11, the clock selection circuit of FIG. 13 selects synchronized clock signal DC2. That is, the delayed clock signal which is a delayed version of the signal DC2 is developed. Thus, by appropriately changing the coupling of the delayed clock signals to the switches, a desired one of the delayed clock signals can be provided as the synchronized clock signal S3 at synchronized clock output terminal 3.

The circuit shown In FIG. 11 is arranged so that delayed clock signal DC1 cannot be selected as synchronized clock signal S3, whereas in the circuit of FIG. 13, the delayed clock signal from the last-stage delaying element is not selected. However, by using such a number of delaying elements as to provide a total delay of longer than one period of the basic clock signal for the delayed clock generating circuit, a delayed clock signal in phase with the delayed clock signal DC1 appears after the delayed clock signal DC5, which is then selected as synchronized clock signal S3. In the circuit shown in FIG. 13, by using such a number of delaying elements as to provide a total delay of longer than one period of the basic clock signal in the delayed clock generating circuit, a delayed clock signal provided by the last-stage delaying element appears before the last delayed clock signal and can be selected as synchronized clock signal S3.

It should be noted that although a negative-going edge (transition) is described as an effective edge at clock input terminals T of flip-flops 201–205, a positive-going edge (transition) may be used instead. Furthermore, the couplings between the delayed clock signals and the switches are not restricted to the ones shown in FIGS. 11 and 13.

In the third embodiment, the delayed clock signal having a transition which occurs later than but closest to a transition in the asynchronous trigger signal TR is used to select a desired delayed clock signal as the synchronized clock signal, but a delayed clock signal having a transition which occurs earlier than but closest to a transition in the asynchronous trigger signal TR may be used instead to select a desired delayed clock signal.

Furthermore, in this embodiment, reset signal RS applied at reset signal input terminal 4 from reset signal source 110 is also applied to RESET input terminals R of respective flip-flops 201–205. Alternatively, a set signal input terminal may be provided in place of reset signal input terminal 4 to apply a set signal to SET input terminals of flip-flops 201–205. In this case, the same result is obtained.

Embodiment 4

Figure 14:
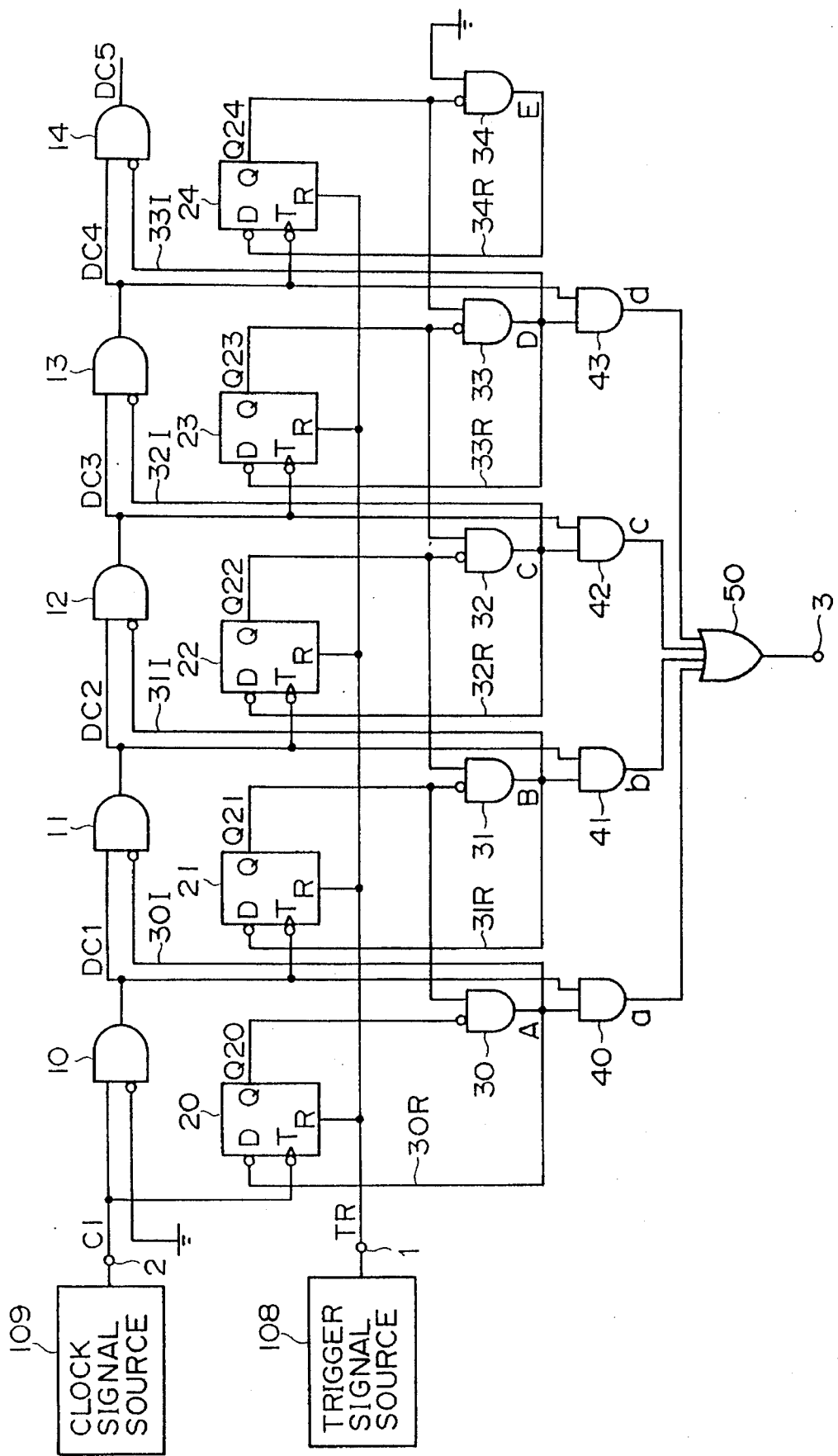
FIG. 14 is a block diagram of a synchronized clock generating apparatus according to a fourth embodiment of the present invention.

FIG. 14 is a block diagram of a synchronized clock generating apparatus according to a fourth embodiment of the present invention. In FIG. 14, delaying elements 10, 11, 12, 13, and 14 are connected in series. Each of the delaying elements 10–14 includes, for example, an AND circuit which provides a substantially constant time delay of 1 ns, for example. The series combination of the delaying elements provides a delayed clock generating circuit.

A basic clock signal C1 is applied from a clock signal source 109 to an input terminal 2 of the apparatus. The basic clock signal C1 applied at input terminal 2 is coupled to a first (non-inverting) input terminal of a first-stage delaying element 10 of which a second (inverting) input terminal is grounded. The outputs of the respective delaying elements 10–14 are coupled to first (non-inverting) input terminals of the respective succeeding stage delaying elements, so that the respective delaying elements 10–14 generate clock signals DC1, DC2, DC3, DC4, and DC5 at their respective output terminals. Clock signals DC1, DC2, DC3, DC4, and DC5 are delayed versions of the clock signals applied to the respective first input terminals delayed by a substantially constant delay time.

Flip-flops 20, 21, 22, 23, and 24, edge-triggered D flip-flops in the illustrated embodiment, are connected in such a manner that the first-stage flip-flop 20 receives, at its clock input terminal T, the undelayed, basic clock signal C1 applied at input terminal 2, and flip-flops 21–24 receive, at their respective clock input terminals T, delayed clock signals DC1–DC4 from delaying elements 10–13, respectively.

A trigger signal source 108 provides a trigger signal TR which is applied to a trigger signal input terminal 1 asynchronously with the basic clock signal C1. Trigger signal TR is coupled to RESET input terminals R of respective flip-flops 20–24. Flip-flops 20–24 produce output signals Q20, Q21, Q22, Q23, and Q24, respectively.

AND circuits 30, 31, 32, 33, and 34 form a SET detecting circuit which detects which one of the flip-flops 20–24 is set first after the trigger signal is applied to the flip-flops to release them from the reset states. AND circuit 30 receives output Q20 from first-stage flip-flop 20 at its first (inverting) input terminal. AND circuit 31 receives output Q21 of second-stage flip-flop 21 at its first (inverting) input terminal. AND circuit 32 receives output Q22 of third flip-flop 22 at its first (inverting) input terminal. AND circuit 33 receives output Q23 of fourth flip-flop 23 at its first (inverting) input terminal. AND circuit 34 receives output Q24 of fifth flip-flop 24 at its first (inverting) input terminal. At their respective second (non-inverting) input terminals, AND circuit 30 receives output Q21 of second flip-flop 21, AND circuit 31 receives output Q22 of third flip-flop 22, AND circuit 32 receives output Q23 of fourth flip-flop 23, and AND circuit 33 receives, output Q24 of fifth flip-flop 24. In the illustrated embodiment of FIG. 14, the second (non-inverting) input terminal of AND circuit 34 is grounded.

Output A of AND circuit 30 is returned to DATA input terminal D of flip-flop 20 through a return path 30R and is also coupled to the second (inverting) input terminal of delaying element 11 through an inhibit path 30I. Similarly, output B of AND circuit 31 is returned to DATA input terminal D of flip-flop 21 through a return path 31R and is also coupled to the second (inverting) input terminal of delaying element 12 through an inhibit path 31I. Output C of AND circuit 32 is coupled to DATA input terminal D of flip-flop 22 through a return path 32R and also to the second (inverting) input terminal of delaying element 13 through an inhibit path 32I. Output D of AND circuit 33 is returned to DATA input terminal D of flip-flop 23 through a return path 33R and is also coupled to the second (inverting) input terminal of delaying element 14 through an inhibit path 33I. Output E of AND circuit 34 is returned to DATA input terminal D of flip-flop 24 through a return path 34R, and if necessary, is coupled to the second input terminal of the succeeding one of the series-connected delaying elements of the delayed clock generating circuit.

AND circuits 40, 41, 42, and 43 form a clock signal detecting logic circuit which detects a desired clock signal after flip-flops 20–24 are released from the reset state. AND circuit 40 receives output A of AND circuit 30 and delayed clock signal DC1 of delaying element 10 at two input terminals thereof, respectively. At its two input terminals, AND circuit 41 receives output B of AND circuit 31 and delayed clock signal DC2 of delaying element 11, respectively. At its two input terminals, AND circuit 42 receives output C of AND circuit 32 and delayed clock signal DC3 of delaying element 12, respectively. At its two input terminals, AND circuit 43 receives output D of AND circuit 33 and delayed clock signal DC4 of delaying element 13, respectively. The respective AND circuits 40, 41, 42, and 43 develop output signals a, b, c, and d, which are applied to an OR circuit 50. An output of OR circuit 50 is coupled to a synchronized clock output terminal 3 at which a clock signal is provided which is in synchronization with the trigger signal.

Figure 15:
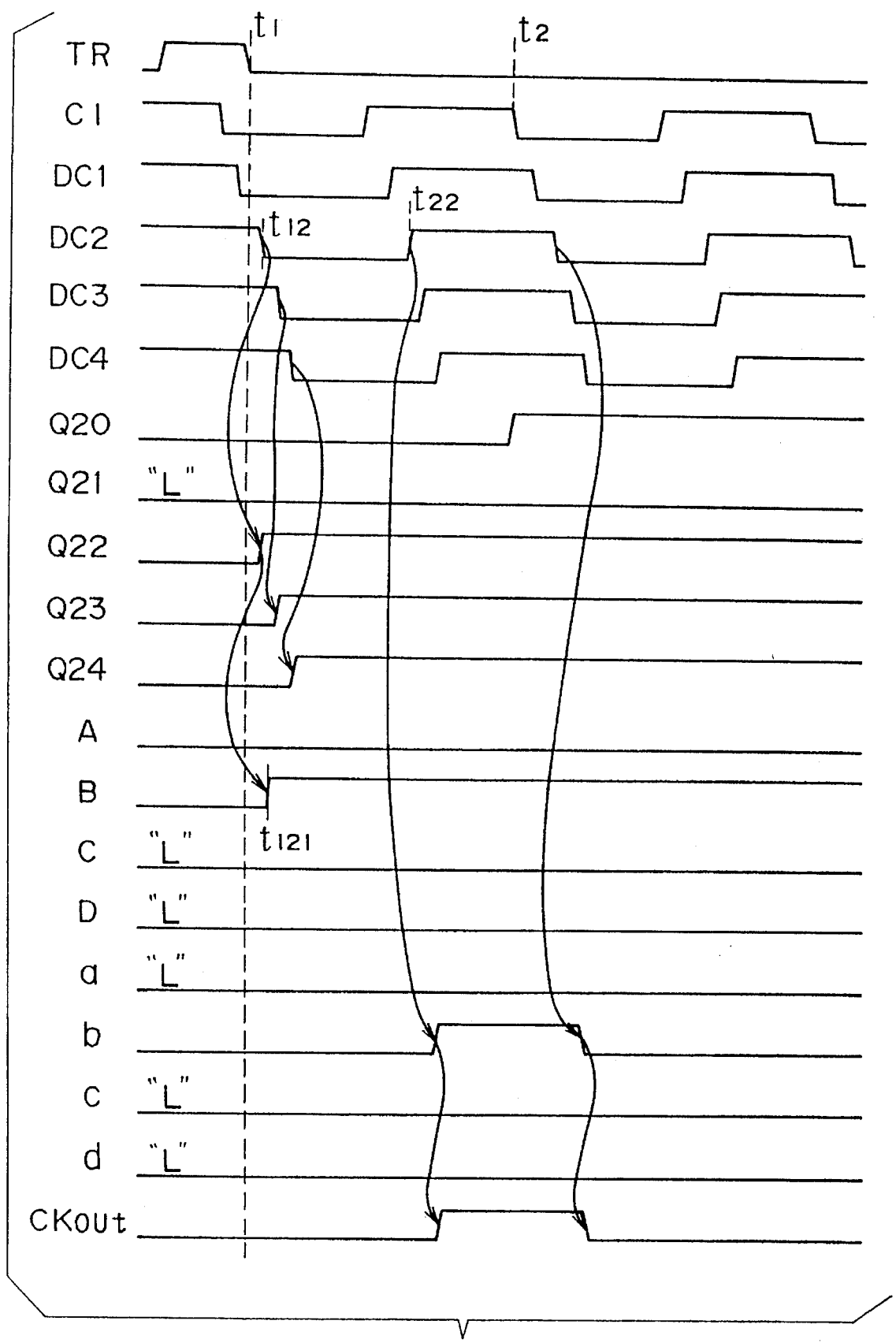
FIG. 15 is a timing diagram for use in explaining the operation of the synchronized clock generating apparatus shown in FIG. 14, where there are no variations in operating speed among components forming the apparatus.

Now the operation of the apparatus shown in FIG. 14 is described with reference to various waveforms shown in FIG. 15. FIG. 15 shows waveforms appearing at various portions of the apparatus of FIG. 14, assuming that there are no variations in operating speed among respective components of an IC forming the apparatus of FIG. 14, such as, for example, variations in flip-flop recovery time (a time necessary for a flip-flop to be able to respond to a clock signal after it is released from the reset state) among flip-flops 20–24. Each of the edge-triggered D flip-flops 20'24 receives the inverted version $\overline{D}$ (D-bar) of data applied to its DATA input terminal D when a falling edge (negative-going transition) occurs in the trigger signal TR.

When a falling edge occurs at a time $t_1$ in trigger signal TR, the respective flip-flops are released from the reset state. Since falling edges in clock signals C1 and DC1 applied to clock input terminals T of flip-flops 20 and 21, respectively, occur before these flip-flops are released from the reset state by trigger signal TR, these flip-flops 20 and 21 are not set, and therefore, their outputs Q20 and Q21 are at the "L" level. A falling edge occurs in delayed clock signal DC2 applied to clock input terminal T of flip-flop 22 at a time $t_{12}$ which is later than the release of the flip-flop 22 from its reset state. Falling edges occur in clock signals DC3 and DC4 later than time $t_{12}$, and accordingly, later than the release of these flip-flops from the reset state by trigger signal TR. Accordingly, these flip-flops 22, 23, and 24 are set to develop the output signals Q22, Q23, and Q24 at the "H" level. This causes output A of AND circuit 30 to be "L", output B of AND circuit 31 to change to "H" at a time $t_{121}$, and outputs C and D of AND circuits 32 and 33, respectively, to both be "L". This indicates that delayed clock signal DC2 is the delayed clock signal which changes first from "H" to "L" after trigger signal TR releases the flip-flops from the reset state.

The respective outputs from AND circuits 30–34 are returned to DATA input terminals D of corresponding flip-flops 20–24. This causes output Q20 of flip-flop 20 to change to "H" at a next falling edge $t_2$ in clock signal C1, while flip-flops 21–24 remain in the previous state even when the next transitions occur in delayed clock signals DC1–DC4. In other words, output Q21 of flip-flop 21 remains "L", whereas outputs Q22–Q24 of flip-flops 22–24 remain "H". Finally, the condition results in which Q20=H, Q21=L, Q22=H, Q23=H, and Q24=H. Accordingly, only output B of AND circuit 31 is maintained at the "H" level. Output B turns on AND circuit 41 so that only delayed clock signal DC2 appears as output b of AND circuit 41. Output b is fed through OR circuit 50 to synchronized clock output terminal 3. Thus, delayed clock signal DC2 is developed as a clock signal $CK_{out}$ which is synchronized with trigger signal TR. Outputs a, c, and d from AND circuits 40, 42, and 43, respectively, are at the "L" level since these AND circuits are not conductive.

In the above-described manner, it is known that the clock signal having a transition from "H" to "L" first occurring after the flip-flops are released from the reset state by trigger signal TR is delayed clock signal DC2. Delayed clock signal DC2 in the illustrated embodiment is developed at output terminal 3 as output clock signal $CK_{out}$ which is in synchronization with trigger signal TR.

The "H" output B of AND circuit 31 is applied through inhibit path 31I to the second (inverting) input terminal of delaying element 12 to inhibit the operation of delaying element 12 so that no clock signals pass through delaying element 12. This causes delayed clocks DC3 and DC4 to be at the "L" level so that outputs c and d of AND circuits 42 and 43 are at the "L" level regardless of the states of AND circuits 32 and 33 (which are actually non-conductive). Thus, as stated previously, output clock signal $CK_{out}$ corresponding to the delayed clock signals DC2 appears at output terminal 3.

Under the condition where there is no variation in operating speed among the components of the IC as assumed in the above discussion, inhibit paths 30I–33I are not particularly necessary. However, if there are variations in operating speed among the components in the IC, as in the case which will be discussed, inhibit paths 30I–33I act advantageously to prevent an inappropriate clock signal from developing as the output of the apparatus.

Figure 16:
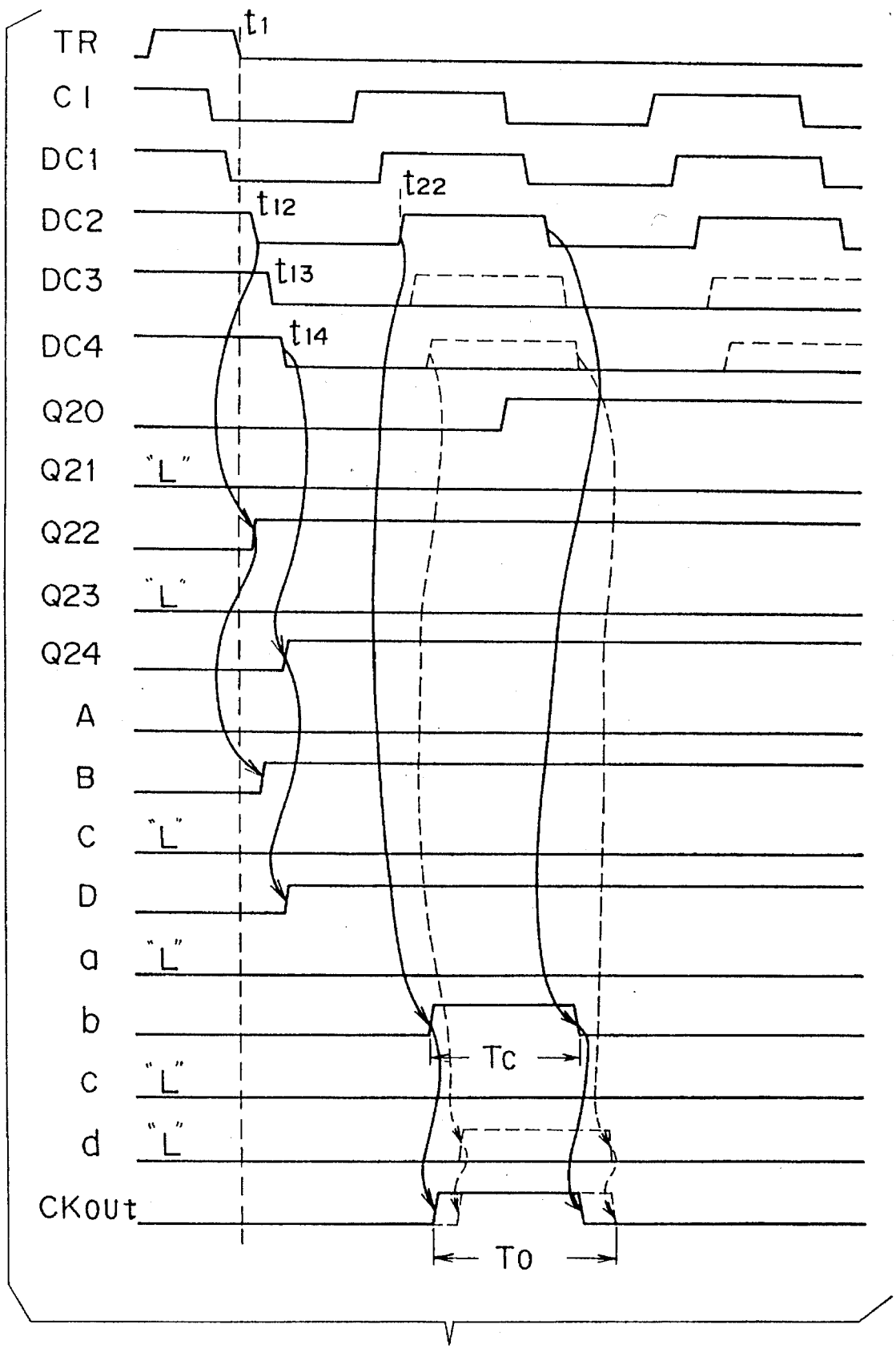
FIG. 16 is a timing diagram for use in explaining the operation of the synchronized clock generating apparatus shown in FIG. 14, where there are variations in operating speed of components forming the apparatus.

FIG. 16 shows waveforms for explaining the operation of the apparatus shown in FIG. 14 when variations in operating speed of the flip-flops are present, or more specifically, variations in the recovery time of the flip-flops (i.e., a time necessary for a flip-flop to respond to a clock signal after it is released from the reset state). In the illustrated example, the recovery time of flip-flop 23 is longer than that of the remaining flip-flops. When the first falling edge in delayed clock signal DC3 occurring after the application of a falling edge in trigger signal TR at a time $t_1$ reaches flip-flop 23 at a time $t_{13}$, flip-flop 23 cannot receive applied delayed clock signal DC3.

First, let it be assumed that inhibit paths 30I–33I are not provided. After trigger signal TR is applied, flip-flop 22 is set by a falling edge occurring at a time $t_{12}$ in delayed clock signal DC2 so that output Q22 goes to "H". As stated above, flip-flop 23 has a longer recovery time, and therefore, is not set by the falling edge occurring in delayed clock signal DC3 at time $t_{13}$. Flip-flop 24 is set by a falling edge occurring at a time $t_{14}$ in delayed clock signal DC4, and accordingly, output Q24 goes to "H". Thus, after the trigger signal is applied, and immediately after the occurrences of the first falling edges in the respective delayed clock signals DC2, DC3, and DC4, the outputs of the respective flip-flops are Q20= L, Q21= L, Q22= H, Q23= L, and Q24= H. This causes AND circuit 30 to be non-conductive, AND circuit 31 to be conductive, AND circuit 32 to be non-conductive, AND circuit 33 to be conductive, and AND circuit 34 to be non-conductive. That is, in addition to output B of AND 30 circuit 31 which is at the "H" level as required, output D of AND circuit 33 is undesirably at the "H" level. The outputs of AND circuits 30–34 are returned to the DATA input terminals of the respective associated flip-flops 20–24 through the associated return paths 30R–34R, whereby output Q20 of flip-flop 20 changes from "L" to "H" while the outputs of the other flip-flops remaining in the previous states. That is, Q20=H, Q21=L, Q22=H, Q23-L, and Q24-H.

Then both AND circuits 41 and 43 become conductive so that output b corresponding to delayed clock signal DC2 and output d (indicated by a broken line) corresponding to the delayed clock signal DC4 are provided at synchronized clock output terminal 3 through OR circuit 50. Thus, the synchronized clock signal $CK_{out}$ at output terminal 3 is the sum of the output corresponding to the output b (indicated by a solid line) and the output corresponding to the output d (indicated by a broken line). As a result, a width $T_o$ of the pulse becomes greater than a nominal width $T_c$.

The inhibit paths 30I-33I prevent occurrence of such an undesirable condition. As described previously, in response to the first falling edge occurring at $t_{12}$ in delayed clock signal DC2, output Q22 of flip-flop 22 becomes "H", and hence, output B of AND circuit 31 becomes "H". Output signal B is applied through inhibit path 31I to the second (inverting) input terminal of delaying element 12 to turn off delaying element 12. Thus, no delayed clock signals are developed from delaying element 12 and from succeeding delaying elements. Since output A of AND circuit 30 applied to the second input terminal of delaying element 11 is "L", delaying element 11 is conductive to permit the clock signal to pass through it so as to produce delayed clock signal DC2. Thus, at output terminal 3, only the output synchronized clock signal $CK_{out}$ corresponding to delayed clock signal DC2 appears, regardless of variations in recovery time of the flip-flops.

Embodiment 5

In the fourth embodiment shown in FIG. 14, flip-flop 22 detects and stores the delayed clock signal DC2 which presents the first falling edge after the flip-flops are released from the reset state by the application of asynchronous trigger signal TR. This delayed clock signal DC2 is selected as the output synchronized clock signal $CK_{out}$ to be developed at output terminal 3. However, when a clock signal at a higher frequency is used, it may occur that before output B of AND circuit 31 goes to "H" in response to output Q22, which has been changed to "H" by the setting of flip-flop 22 by delayed clock signal DC2, a rising edge occurs in delayed clock signal DC2 at a time $t_{22}$ in FIG. 15. This causes the width of the output signal pulse b of AND circuit 41 to become narrower, and hence, the width of the output synchronized clock signal pulse $CK_{out}$ becomes narrower than its nominal width $T_c$. Thus, in order to avoid this erroneous operation, it is desirable to select delayed clock signal DC3, instead of delayed clock signal DC2, as the output synchronized clock signal $CK_{out}$ from output terminal 3. The fifth embodiment shown in FIG. 17 is for that purpose.

Figure 17:
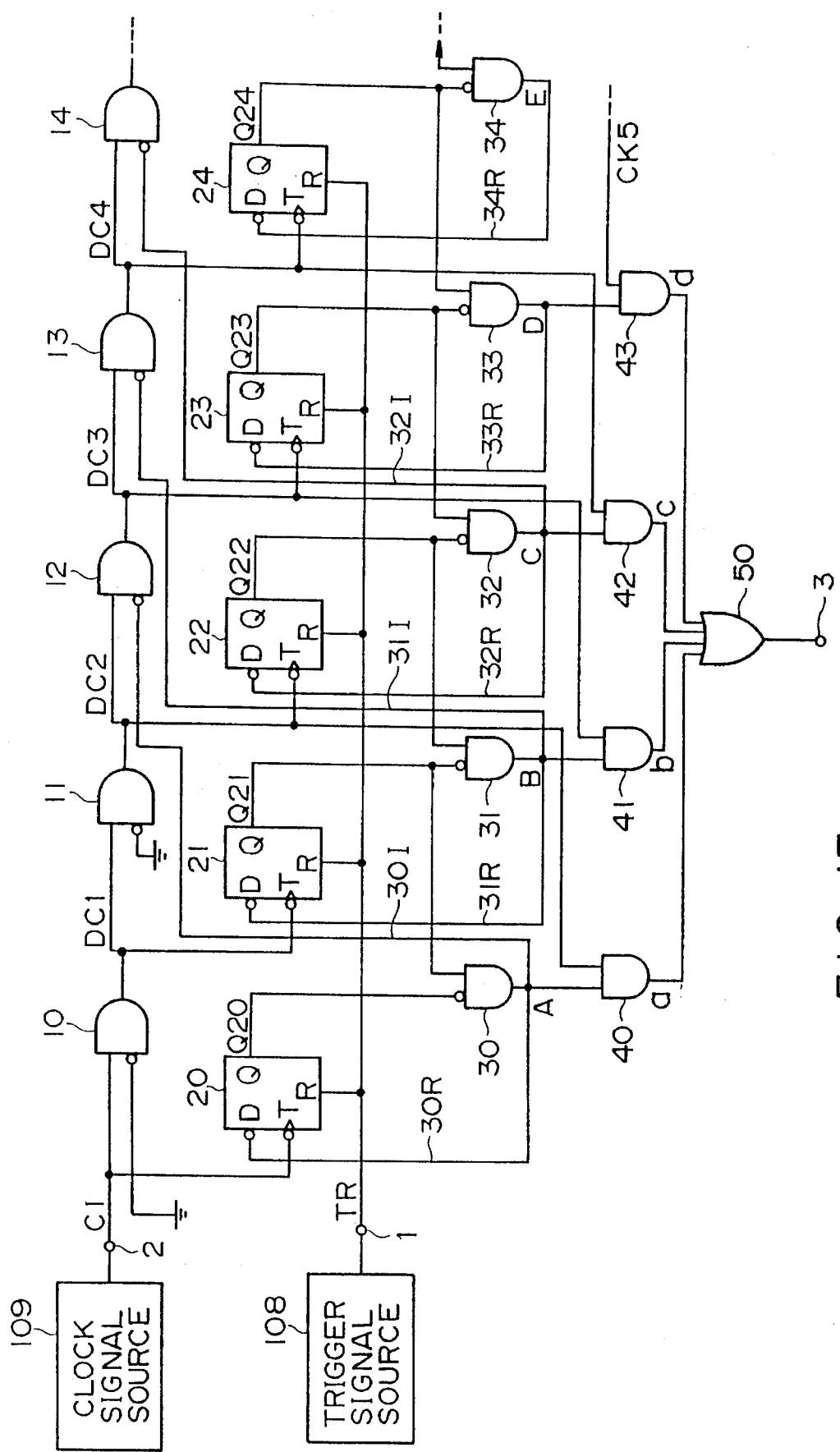
FIG. 17 is a block diagram of a synchronized clock generating apparatus according to a fifth embodiment of the present invention.

In the synchronized clock generating apparatus according to the fifth embodiment of the present invention shown in FIG. 17, the second (inverting) input terminal of delaying element 11 is grounded. Inhibit path 31I is connected to the second input terminal of delaying element 13. Inhibit path 32I is connected to the second input terminal of delaying element 14. AND circuit 40 receives output A of AND circuit 30 and delayed clock signal DC2 at its input terminals. AND circuit 41 receives output B of AND circuit 31 and delayed clock signal DC3 at its input terminals. AND circuit 42 receives output C of AND circuit 32 and delayed clock signal DC4 at its input terminals. AND circuit 43 receives output D of AND circuit 33 and delayed clock signal DC5 at its input terminals. The remaining configurations are the same as those of the fourth embodiment shown in FIG. 14.

In the apparatus shown in FIG. 17, when asynchronous trigger signal TR is applied, flip-flop 22 is set in response to the first falling edge occurring in delayed clock signal DC2 at time $t_{12}$, and therefore, its output Q22 goes to "H". This turns on AND circuit 31 so that AND circuit 41 selects delayed clock signal DC3 rather than delayed clock signal DC2. The function of inhibit paths 30I–32I is the same as in the fourth embodiment. In the example being described now, output B of AND circuit 31 at the "H" level is applied via inhibit path 31I to the second input terminal of delaying element 13 to inhibit a delayed clock signal from appearing at the output of delaying element 13.

Embodiment 6

In the apparatus according to the fourth embodiment shown in FIG. 14, depending on the operating speeds of flip-flops 20–24, AND circuits 30–34, and the speeds of the level changes of delayed clock signals DC1–DC4, two inputs to AND circuits 30–33 may change simultaneously. This is described in greater detail with reference to FIG. 15. In response to the falling edge at time $t_{12}$ of delayed clock signal DC2, output Q22 of flip-flop 22 changes to "H" and output B of AND circuit 31 changes to "H" at a time $t_{121}$.

If the operating speeds of flip-flop 22 and AND circuit 31 are high, time $t_{12}$ when the falling edge occurs in delayed clock signal DC2 and time $t_{121}$ when the falling edge occurs in output B of AND circuit 31 may substantially coincide with each other. This causes a spike to appear in output b of AND circuit 41, which may be undesirably coupled through OR circuit 50 to synchronized clock output terminal 3.

Figure 18:
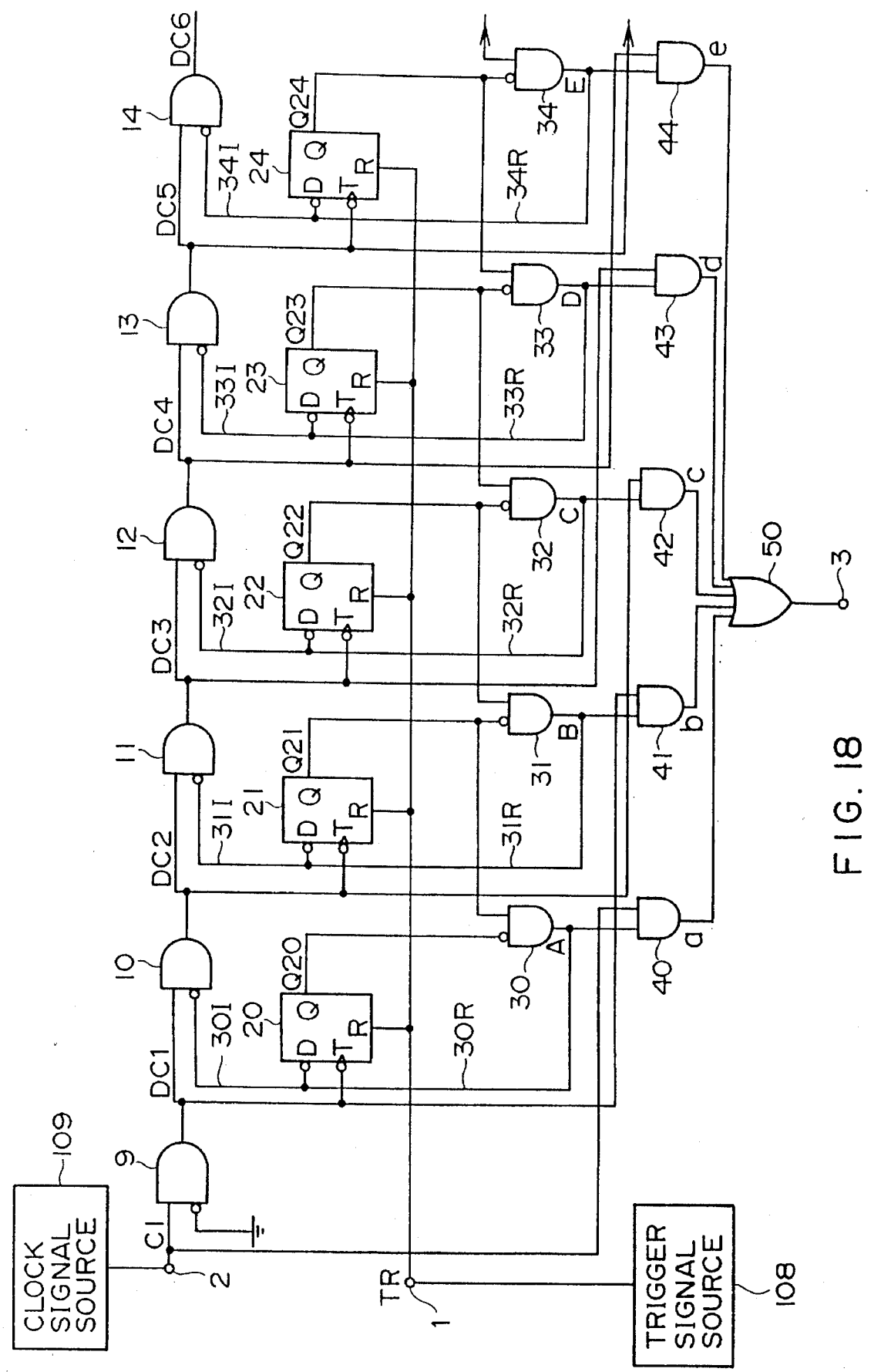
FIG. 18 is a block diagram of a synchronized clock generating apparatus according to a sixth embodiment of the present invention.

If the frequency of the clock signal is low so that the configuration shown in FIG. 17 need not be employed, the apparatus according to a sixth embodiment shown in FIG. 18 may be desirable. In FIG. 18, the components equivalent to those of the embodiment shown in FIG. 17 have the same reference numerals and are not further described. In the embodiment shown in FIG. 18, an additional delaying element 9 is used in the stage preceding delaying element 10. Clock signal C1 from clock signal source 109 is applied to a first (non-inverting) input terminal of delaying element 9 of which the second (inverting) input terminal is grounded. Thus, at the respective outputs of the delaying elements, delayed clock signals DC1–DC6 appear which are successively delayed by a fixed time (e.g., 1 ns) from the preceding delayed clock signals.

The undelayed basic clock signal C1 is applied to one input of AND circuit 40. Delayed clock signals DC1–DC5 are applied respectively to clock input terminals T of flip-flops 20–24 and to respective inputs of AND circuits 41–44. Delayed clock signal DC6 may be applied to the succeeding delaying element (not shown) and to the succeeding AND circuit (not shown), as occasion demands. The outputs of AND circuits 30–34 are returned through the respective return paths 30R–34R to DATA input terminals D of associated flip-flops 20–24 and also coupled through inhibit paths 30I–34I to the second (inverting) input terminals of respective associated delaying elements 10–14. The outputs from AND circuits 40–44 are coupled to OR circuit 50.

Figure 19:
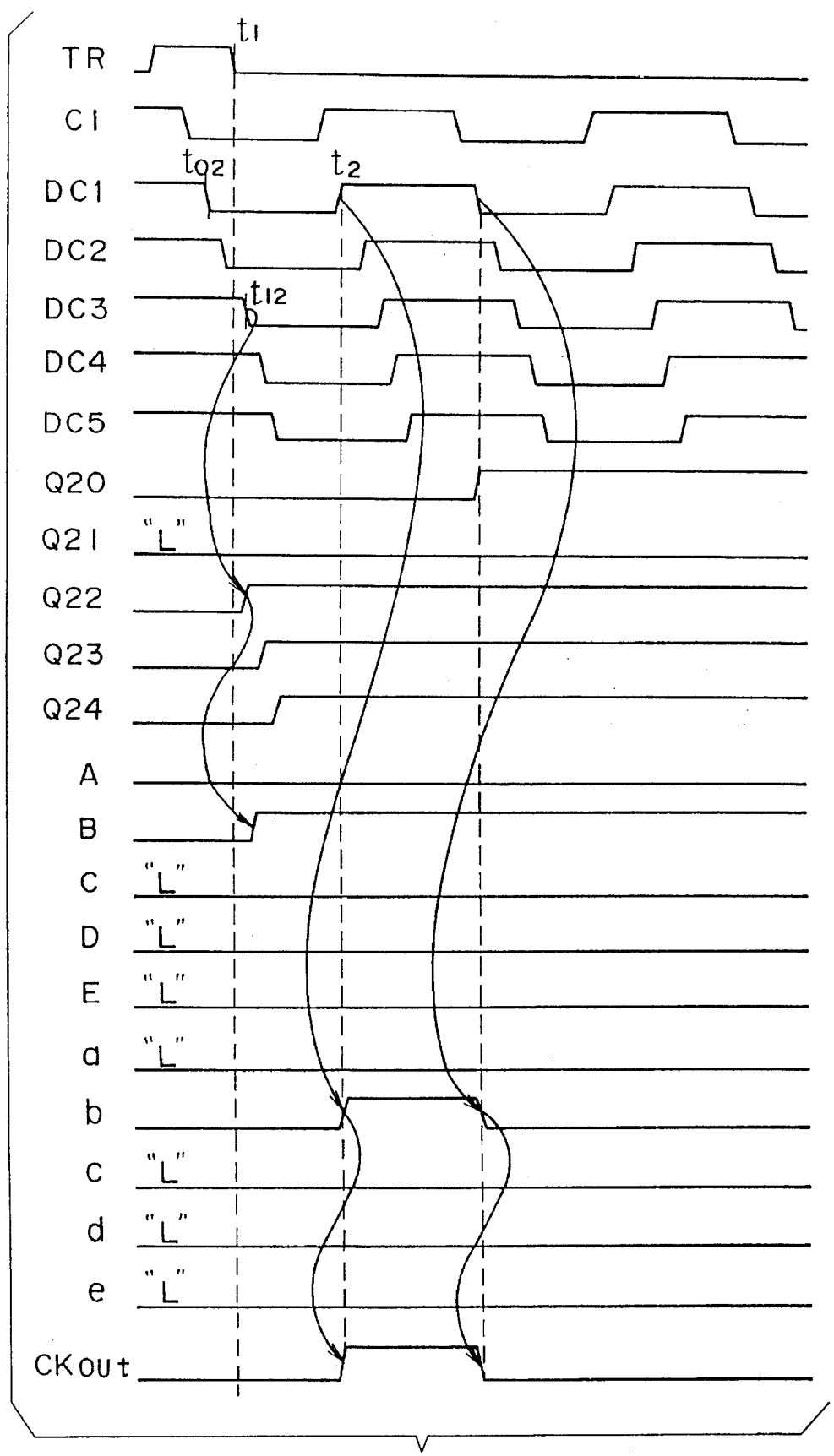
FIG. 19 is a timing diagram for use in explaining the operation of the synchronized clock generating apparatus shown in FIG. 18.

Now the operation of the apparatus of FIG. 18 is described with reference to FIG. 19. In this apparatus, the first falling edge appearing in the delayed clock signals after a falling edge occurring at a time $t_1$ in the trigger signal TR, that is, the falling edge occurring at a time $t_{12}$ in the delayed clock signal DC3 in the example shown in FIG. 19, sets an associated flip-flop, i.e., the flip-flop 22, so that its output Q22 goes to the "H" level. At this instant, output Q21 of flip-flop 21 is "L", so AND circuit 31 is rendered conductive to develop output B at the "H" level. Thus, AND circuit 41 becomes conductive. Since AND circuit 41 receives the delayed clock signal DC1 at the other input terminal, output b of AND circuit 41 changes to the "H" level in response to a rising edge in delayed clock signal DC1 occurring at a time $t_2$. Thus, an output synchronized clock signal $CK_{out}$ corresponding to delayed clock signal DC1 is provided at synchronized clock output terminal 3. Since the level of delayed clock signal DC1 is secured at "L" at a time $t_{02}$, which is earlier than time $t_{12}$ when the falling edge occurs in delayed clock signal DC3 which is detected first after the occurrence of a falling edge in the trigger signal TR, the two inputs to AND circuit 41 never change simultaneously to produce a spike in the output as in the apparatus shown in FIG. 14.

The output synchronized clock signal $CK_{out}$ corresponding to clock signals C1 or DC2 can be produced by slightly modifying the circuit connections.

The purpose of returning the outputs of AND circuits 30–34 via return paths 30R–34R to DATA input terminals D of associated flip-flops 20–24, and the purpose of coupling the outputs of AND circuits 30–34 via inhibit paths 30I–34I to the second (inverting) inputs of the associated delaying elements 10–14, are the same as the purposes described with reference to the embodiments shown in FIGS. 14 and 17. In this sixth embodiment, the "H" output from AND circuit 31 is applied to the second input terminal of delaying element 11 to inhibit any delayed clock signal from being transmitted to the succeeding delaying elements.

According to the fourth, fifth and sixth embodiments, trigger signal TR is applied to the RESET terminals of the respective flip-flops and the Q outputs of the flip-flops are utilized. However, trigger signal TR may be applied to the SET input terminals of the flip-flops and the Q-bar outputs may be utilized. In summary, the present invention can be implemented with such a logic that the delayed clock signal having a transition first occurring after the trigger signal is applied is detected. The detected delayed clock signal is returned via the return path to the flip-flop for storage. The detected delayed clock signal or the preceding or succeeding one is selected as a desired delayed clock signal using the detected delayed clock signal. The number of the serially connected delaying elements, 10–14 or 9–14, and the number of the flip-flops 20–24 may be changed depending on the circuit designs employed.

As described in detail, in the synchronized clock generating apparatus according to the present invention, a plurality of delayed clock signals are generated by a plurality of simple logic elements, such as buffer amplifiers and AND circuits, to select a desired one of the delayed clock signals in relation to the occurrence of an asynchronous trigger signal, and accordingly, a jitter can be limited to a time equal to the delay time provided by one delaying element. Therefore, a clock signal highly precisely synchronized with the trigger signal is available without resorting to a high frequency clock signal generating circuit which generates high frequency clock signals at, for example, 1 GHz.

Thus, according to the present invention, a highly precisely synchronized clock signal generating apparatus can be manufactured at a low cost. This apparatus can be used widely in interfaces between systems operating with different basic clocks. Furthermore, in the synchronized clock generating apparatus according to the present invention, large amounts of high frequency noise or undesirable radiation are not produced so that it can be safely used in horizontal and vertical synchronizing circuits of image processing systems, such as a digital copying machine. In addition, it requires no special wafer processing for the apparatus to be integrated. Very ordinary processing is sufficient for making an apparatus with a jitter on the order of ±1 ns.

According to the present invention, once a desired clock signal is selected, the apparatus operates correctly to provide the synchronized clock signal regardless of some variations in operating speed among the components forming the apparatus, by virtue of the inhibit paths provided between the outputs of the respective logic circuits and the associated delaying elements for inhibiting any delayed clock signals from being applied to the succeeding delaying elements.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A synchronized clock generating apparatus comprising:

a delayed clock generating circuit;

said delayed clock generating circuit including a clock input having a basic clock signal applied thereto;

said delayed clock generating circuit including further a plurality of delaying elements connected in series;

said plurality of delaying elements being effective for producing a plurality of delayed clock signals each successively delayed relative to said basic clock signal;

a plurality of flip-flops, each having a respective one of said plurality of delayed clock signals applied to a first input thereof;

said plurality of flip-flops each having a second input with a trigger signal, asynchronous with said basic clock signal, applied thereto;

each of said plurality of flip-flops having a third input and a flip-flop output;

said plurality of flip-flops receiving said trigger signal and said delayed clock signals such that each flip-flop, of said plurality of flip-flops, switches a flip-flop output signal at said flip-flop output thereof to a reset state from a set state in response to receiving said respective one of said delayed clock signals after a transition of said trigger signal;

a clock selection circuit having a first plurality of inputs receiving said delayed clock signals, each of a second plurality of inputs receiving a respective one of said flip-flop output signals, a plurality of feedback outputs, and a selected clock output;

said clock selection circuit applying a selected one of said delayed clock signals to said selected clock output and a feedback signal to a selected feedback output of said feedback outputs in response to a first one of said flip-flop output signals switching to said reset state; and feedback means for connecting said feedback outputs to said third input of respective ones of said plurality of flip flops.

2. A synchronized clock generating apparatus according to claim 1, further comprising a plurality of inhibit paths for connecting said feedback outputs to said disabling input for inhibiting from being transmitted to said delaying elements any of said delayed clock signals succeeding said selected one of said delayed clock signals and wherein said plurality of delay elements have disabling inputs.

3. A synchronized clock generating apparatus comprising:

a delayed clock generating circuit;

said delayed clock generating circuit including a clock input having a basic clock signal applied thereto;

said delayed clock generating circuit including further a plurality of delaying elements connected in series;

said plurality of delaying elements being effective for producing a plurality of delayed clock signals each successively delayed relative to said basic clock signal;

a plurality of flip-flops, each having a respective one of said plurality of delayed clock signals applied to a first input thereof;

said plurality of flip-flops each having a second input with a trigger signal, asynchronous with said basic clock signal, applied thereto;

each of said plurality of flip-flops having a third input and a flip-flop output;

said plurality of flip-flops receiving said trigger signal and said delayed clock signals such that each flip-flop, of said plurality of flip-flops, switches a flip-flop output signal at said flip-flop output thereof to a reset state from a set state in response to receiving a transition of said respective one of said delayed clock signals after a transition of said trigger signal;

a clock selection circuit having a first plurality of inputs receiving said delayed clock signals, each of a second plurality of inputs receiving a respective one of said flip-flop output signals, a plurality of feedback outputs, and a selected clock output;

said clock selection circuit applying a first one of said delayed clock signals having a transition after a transition of said trigger signal to said selected clock output and a feedback signal to a selected feedback output of said feedback outputs in response to a first one of said flip-flop output signals switching to said reset state; and feedback means for connecting said feedback outputs to said third input of respective ones of said plurality of flip flops.

4. A synchronized clock generating apparatus comprising:

a delayed clock generating circuit;

said delayed clock generating circuit including a clock input having a basic clock signal applied thereto;

said delayed clock generating circuit including further a plurality of delaying elements connected in series;

said plurality of delaying elements being effective for producing a plurality of delayed clock signals each successively delayed relative to said basic clock signal;

a plurality of flip-flops, each having a respective one of said plurality of delayed clock signals applied to a first input thereof;

said plurality of flip-flops each having a second input with a trigger signal, asynchronous with said basic clock signal, applied thereto;

each of said plurality of flip-flops having a third input and a flip-flop output;

said plurality of flip-flops receiving said trigger signal and said delayed clock signals such that each flip-flop, of said plurality of flip-flops, switches a flip-flop output signal at said flip-flop output thereof to a reset state from a set state in response to receiving a transition of said respective one of said delayed clock signals after a transition of said trigger signal;

a clock selection circuit having a first plurality of inputs receiving said delayed clock signals, each of a second plurality of inputs receiving a respective one of said flip-flop output signals, a plurality of feedback outputs, and a selected clock output;

said clock selection circuit applying to said selected clock output a selected one of said delayed clock signals and a feedback signal to a selected feedback output of said feedback outputs in response to a first one of said flip-flop output signals switching to said reset state;

said selected one of said delayed clock signals having a transition succeeding a first one of said delayed clock signals having a transition after a transition of said trigger signal, by a predetermined period; and feedback means for connecting said feedback outputs to said third input of respective ones of said plurality of flip flops.

5. A synchronized clock generating apparatus according to claim 4, further comprising a plurality of inhibit paths for connecting said feedback outputs to said disabling input to inhibit from being transmitted to said delaying elements any of said delayed clock signals succeeding said selected one of said delayed clock signals and wherein said plurality of delay elements have disabling inputs.

6. A synchronized clock generating apparatus comprising:

a delayed clock generating circuit;

said delayed clock generating circuit including a clock input having a basic clock signal applied thereto;

said delayed clock generating circuit including further a plurality of delaying elements connected in series;

said plurality of delaying elements being effective for producing a plurality of delayed clock signals each successively delayed relative to said basic clock signal;

a plurality of flip-flops, each having a respective one of said plurality of delayed clock signals applied to a first input thereof;

said plurality of flip-flops each having a second input with a trigger signal, asynchronous with said basic clock signal, applied thereto;

each of said plurality of flip-flops having a third input and a flip-flop output;

said plurality of flip-flops receiving said trigger signal and said delayed clock signals such that each flip-flop, of said plurality of flip-flops, switches a flip-flop output signal at said flip-flop output thereof to a reset state from a set state in response to receiving a transition of said respective one of said delayed clock signals after a transition of said trigger signal;

a clock selection circuit having a first plurality of inputs receiving said delayed clock signals, each of a second plurality of inputs receiving a respective one of said flip-flop output signals, a plurality of feedback outputs, and a selected clock output;

said clock selection circuit applying to said selected clock output a selected one of said delayed clock signals and a feedback signal to a selected feedback output of said feedback outputs in response to a first one of said flip-flop output signals switching to said reset state;

said selected one of said delayed clock signals having a transition preceding a first one of said delayed clock signals having a transition after a transition of said trigger signal, by a predetermined period; and feedback means for connecting said feedback outputs to said third input of respective ones of said plurality of flip flops.

7. A synchronized clock generating apparatus according to claim 6, further comprising a plurality of inhibit paths for connecting said feedback outputs to said disabling input for inhibiting from being transmitted to said delaying elements any of said delayed clock signals succeeding said selected one of said delayed clock signals and wherein said plurality of delay elements have disabling inputs.

8. A synchronized clock generating apparatus comprising:

a delayed clock generating circuit;

said delayed clock generating circuit including a clock input having a basic clock signal applied thereto;

said delayed clock generating circuit including further a plurality of delaying elements connected in series;

said plurality of delaying elements being effective for producing a plurality of delayed clock signals each successively delayed relative to said basic clock signal;

a plurality of flip-flops, each having a respective one of said plurality of delayed clock signals applied to a first input thereof;

said plurality of flip-flops each having a second input with a trigger signal, asynchronous with said basic clock signal, applied thereto;

each of said plurality of flip-flops having a third input and a flip-flop output;

said plurality of flip-flops receiving said trigger signal and said delayed clock signals such that each flip-flop, of said plurality of flip-flops, switches a flip-flop output signal at said flip-flop output thereof to a reset state from a set state in response to receiving a transition of said respective one of said delayed clock signals after a transition of said trigger signal;

a clock selection circuit having a first plurality of inputs receiving said delayed clock signals, each of a second plurality of inputs receiving a respective one of said flip-flop output signals, a plurality of feedback outputs, and a selected clock output;

said clock selection circuit applying to said selected clock output a selected one of said delayed clock signals and a feedback signal to a selected feedback output of said feedback outputs in response to one of said flip-flop output signals switching to said reset state and another one of said flip-flop outputs, preceding said one of said flip-flop output signals, being in said set state;

said selected one of said delayed clock signals having a transition with a predetermined relationship to a said one of said delayed clock signals; and feedback means for connecting said feedback outputs to said third input of respective ones of said plurality of flip flops.

9. A synchronized clock generating apparatus according to claim 8 further comprising a plurality of inhibit paths for connecting said feedback outputs to said disabling input for inhibiting from being transmitted to said delaying elements any of said delayed clock signals succeeding said selected one of said delayed clock signals and wherein said plurality of delay elements have disabling inputs.

10. A synchronized clock generating apparatus comprising:

a delayed clock generating circuit;

said delayed clock generating circuit including a clock input having a basic clock signal applied thereto;

said delayed clock generating circuit including further a plurality of delaying elements connected in series;

each of said plurality of delaying elements of said delayed clock generating circuit being a semiconductor logic element;

said plurality of delaying elements being effective for producing a plurality of delayed clock signals each successively delayed relative to said basic clock signal;

a plurality of flip-flops, each having a respective one of said plurality of delayed clock signals applied to a first input thereof;

said plurality of flip-flops each having a second input with a trigger signal, asynchronous with said basic clock signal, applied thereto;

each of said plurality of flip-flops having a third input and a flip-flop output;

said plurality of flip-flops receiving said trigger signal and said delayed clock signals such that each flip-flop, of said plurality of flip-flops, switches a flip-flop output signal at said flip-flop output thereof to a reset state from a set state in response to receiving a transition of said respective one of said delayed clock signals after a transition of said trigger signal;

a clock selection circuit having a first plurality of inputs receiving said delayed clock signals, each of a second plurality of inputs receiving a respective one of said flip-flop output signals, a plurality of feedback outputs, and a selected clock output;

said clock selection circuit applying to said selected clock output a selected one of said delayed clock signals and a feedback signal to a selected feedback output of said feedback outputs in response to one of said flip-flop output signals switching to said reset state and another one of said flip-flop outputs, preceding said one of said flip-flop output signals, being in said set state;

said selected one of said delayed clock signals having a transition with a predetermined relationship to a said one of said delayed clock signals; and feedback means for connecting said feedback outputs to said third input of respective ones of said plurality of flip flops.

11. A synchronized clock generating apparatus comprising:

a delayed clock generating circuit, said delayed clock generating circuit including a clock input having a basic clock signal applied thereto;

said delayed clock generating circuit including further a plurality of delaying elements connected in series;

each of said plurality of delaying elements of said delayed clock generating circuit being a semiconductor logic element;

said plurality of delaying elements being effective for producing a plurality of delayed clock signals each successively delayed relative to said basic clock signal;

a plurality of flip-flops, each having a respective one of said plurality of delayed clock signals applied to a first input thereof;

said plurality of flip-flops each having a second input with a trigger signal, asynchronous with said basic clock signal, applied thereto;

each of said plurality of flip-flops having a third input and a flip-flop output;

said plurality of flip-flops receiving said trigger signal and said delayed clock signals such that each flip-flop, of said plurality of flip-flops, switches a flip-flop output signal at said flip-flop output thereof to a reset state from a set state in response to receiving a transition of said respective one of said delayed clock signals after a transition of said trigger signal;

a clock selection circuit having a first plurality of inputs receiving said delayed clock signals, each of a second plurality of inputs receiving a respective one of said flip-flop output signals, a plurality of feedback outputs, and a selected clock output;

said clock selection circuit applying a selected one of said delayed clock signals to said selected clock output and a feedback signal to a selected feedback output of said feedback outputs in response to a first one of said flip-flop output signals switching to said reset state; and feedback means for connecting said feedback outputs to said third input of respective ones of said plurality of flip flops.

12. A synchronized clock generating apparatus comprising:

a delayed clock generating circuit;

said delayed clock generating circuit including a clock input having a basic clock signal applied thereto;

said delayed clock generating circuit including further a plurality of delaying elements connected in series;

each one of said plurality of delaying elements of said delayed clock generating circuit being a semiconductor logic element;

said plurality of delaying elements being effective for producing a plurality of delayed clock signals each successively delayed relative to said basic clock signal;

a plurality of flip-flops, each having a respective one of said plurality of delayed clock signals applied to a first input thereof;

said plurality of flip-flops each having a second input with a trigger signal, asynchronous with said basic clock signal, applied thereto;

each of said plurality of flip-flops having a third input and a flip-flop output;

said plurality of flip-flops receiving said trigger signal and said delayed clock signals such that each flip-flop, of said plurality of flip-flops, switches a flip-flop output signal at said flip-flop output thereof to a reset state from a set state in response to receiving a transition of said respective one of said delayed clock signals after a transition of said trigger signal;

a clock selection circuit having a first plurality of inputs receiving said delayed clock signals, each of a second plurality of inputs receiving a respective one of said flip-flop output signals, a plurality of feedback outputs, and a selected clock output;

said clock selection circuit applying a first one of said delayed clock signals having a transition after a transition of said trigger signal to said selected clock output and a feedback signal to a selected feedback output of said feedback outputs in response to a first one of said flip-flop output signals switching to said reset state; and feedback means for connecting said feedback outputs to said third input of respective ones of said plurality of flip flops.

13. A synchronized clock generating apparatus comprising:

a delayed clock generating circuit;

said delayed clock generating circuit including a clock input having a basic clock signal applied thereto;

said delayed clock generating circuit including further a plurality of delaying elements connected in series;

each one of said plurality of delaying elements of said delayed clock generating circuit being a semiconductor logic element;

said plurality of delaying elements being effective for producing a plurality of delayed clock signals each successively delayed relative to said basic clock signal;

a plurality of flip-flops, each having a respective one of said plurality of delayed clock signals applied to a first input thereof;

said plurality of flip-flops each having a second input with a trigger signal, asynchronous with said basic clock signal, applied thereto;

each of said plurality of flip-flops having a third input and a flip-flop output;

said plurality of flip-flops receiving said trigger signal and said delayed clock signals such that each flip-flop, of said plurality of flip-flops, switches a flip-flop output signal at said flip-flop output thereof to a reset state from a set state in response to receiving a transition of said respective one of said delayed clock signals after a transition of said trigger signal;

a clock selection circuit having a first plurality of inputs receiving said delayed clock signals, each of a second plurality of inputs receiving a respective one of said flip-flop output signals, a plurality of feedback outputs, and a selected clock output;

said clock selection circuit applying to said selected clock output a selected one of said delayed clock signals and a feedback signal to a selected feedback output of said feedback outputs in response to a first one of said flip-flop output signals switching to said reset state;

said selected one of said delayed clock signals having a transition succeeding a first one of said delayed clock signals having a transition after a transition of said trigger signal, by a predetermined period; and feedback means for connecting said feedback outputs to said third input of respective ones of said plurality of flip flops.

14. A synchronized clock generating apparatus comprising:

a delayed clock generating circuit;

said delayed clock generating circuit including a clock input having a basic clock signal applied thereto;

said delayed clock generating circuit including further a plurality of delaying elements connected in series;

each one of said plurality of delaying elements of said delayed clock generating circuit being a semiconductor logic element;

said plurality of delaying elements being effective for producing a plurality of delayed clock signals each successively delayed relative to said basic clock signal;

a plurality of flip-flops, each having a respective one of said plurality of delayed clock signals applied to a first input thereof;

said plurality of flip-flops each having a second input with a trigger signal, asynchronous with said basic clock signal, applied thereto;

each of said plurality of flip-flops having a third input and a flip-flop output;

said plurality of flip-flops receiving said trigger signal and said delayed clock signals such that each flip-flop, of said plurality of flip-flops, switches a flip-flop output signal at said flip-flop output thereof to a reset state from a set state in response to receiving a transition of said respective one of said delayed clock signals after a transition of said trigger signal;

a clock selection circuit having a first plurality of inputs receiving said delayed clock signals, each of a second plurality of inputs receiving a respective one of said flip-flop output signals, a plurality of feedback outputs, and a selected clock output;

said clock selection circuit applying to said selected clock output a selected one of said delayed clock signals and a feedback signal to a selected feedback output of said feedback outputs in response to a first one of said flip-flop output signals switching to said reset state;

said selected one of said delayed clock signals having a transition preceding a first one of said delayed clock signals having a transition after a transition of said trigger signal, by a predetermined period; and feedback means for connecting said feedback outputs to said third input of respective ones of said plurality of flip flops.

\* \* \* \* \*